(12) United States Patent
Aikawa et al.

(10) Patent No.: US 6,188,640 B1
(45) Date of Patent: Feb. 13, 2001

(54) DATA OUTPUT CIRCUITS FOR SEMICONDUCTOR MEMORY DEVICES

(75) Inventors: Tadao Aikawa; Yasuharu Sato; Hiroyuki Kobayashi; Waichirou Fujieda, all of Kawasaki (JP)

(73) Assignee: Fujitsu Limited, Kawasaki (JP)

( * ) Notice: Under 35 U.S.C. 154(b), the term of this patent shall be extended for 0 days.

(21) Appl. No.: 09/398,828

(22) Filed: Sep. 17, 1999

(30) Foreign Application Priority Data

Sep. 18, 1998 (JP) .................................................. 10-265219

(51) Int. Cl.⁷ ....................................................... G11C 8/00
(52) U.S. Cl. ....................... 365/233; 365/189.05; 365/236
(58) Field of Search .............................. 365/233, 189.05, 365/194, 236

(56) References Cited

U.S. PATENT DOCUMENTS 6,011,749 * 1/2000 Roth et al. ........................ 365/194 X
6,043,697 * 3/2000 Jang ................................. 365/233 X
6,052,329 * 4/2000 Nishino et al. ............. 365/189.05 X

* cited by examiner

Primary Examiner—Huan Hoang
(74) Attorney, Agent, or Firm—Arent Fox Kintner Plotkin & Kahn, PLLC

(57) ABSTRACT

A data output circuit for a semiconductor memory device, such as a synchronous DRAM (SDRAM) includes an output control circuit that acquires a command in sync with an input internal clock signal and generates an output control signal used to determine the output timing of a data signal. An output buffer receives the output control signal and then outputs the data signal in accordance with an output internal clock signal. The phase of the output internal clock signal is advanced from that of the input internal clock signal. The output control circuit also includes a latency counter that generates the output control signal by counting the cycles of a second output internal clock signal, which is delayed from the first output internal clock signal.

12 Claims, 12 Drawing Sheets

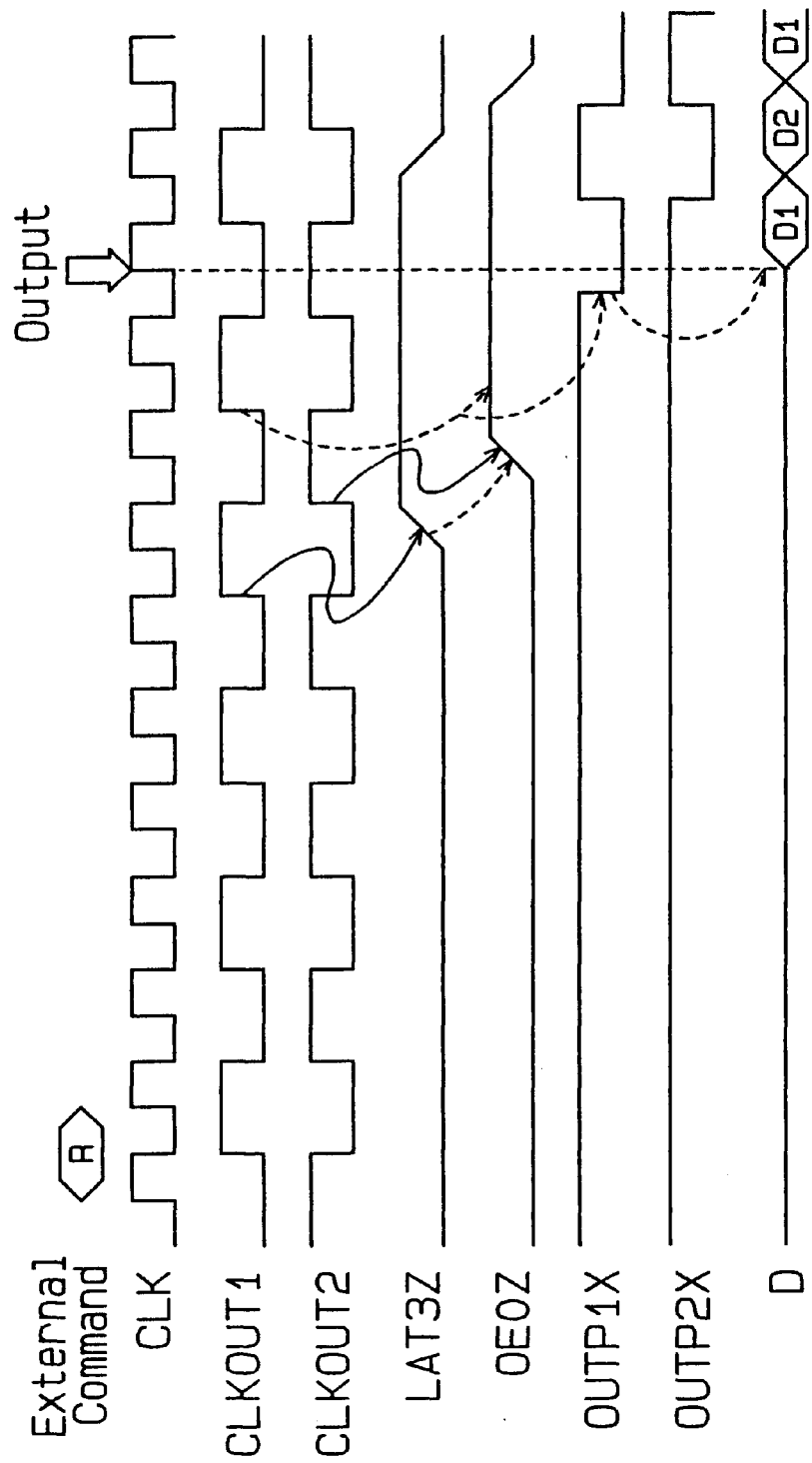

DATA OUTPUT CIRCUITS FOR SEMICONDUCTOR MEMORY DEVICES

BACKGROUND OF THE INVENTION

The present invention relates to semiconductor memory devices, and more particularly, to data output circuits for controlling the output of data signals in semiconductor memory devices.

A synchronous dynamic random access memory (SDRAM) is required to have high speed, low power consumption, and a multiple bit output, high speed interface. Accordingly, a packet type SDRAM, which can consecutively provide RAS and CAS data, has been proposed. A double data rate (DDR) type SDRAM, which outputs a data signal in synchronism with external clock signals CLK, /CLK and increases the output rate superficially by two times has also been proposed.

A DRAM employing a higher speed interface has also been proposed. High speed interface technology, such as a packet or DDR type interface, requires a modified DRAM controller. Providing external commands is difficult in a packet DRAM, and receiving data signals in accordance with the rising of the external clock signals CLK, /CLK is difficult in a DDR DRAM.

An improved synchronous DRAM (SDRAM) receives external command and addresses together and outputs a data signal in synchronism with the external clock signal of a DRAM controller. The improved synchronous DRAM generates internal signals by dividing the external clock signal in half and further generates a first internal clock signal having a phase of 0° and a second internal clock signal having a phase of 180°. In other words, if the clock frequency of the external clock signal is 400 megahertz, the clock frequency of the first and second internal clock signals is 200 megahertz and the phases of the first and second internal clock signals are offset from each other by half a cycle. In the improved SDRAM, the first and second internal clock signals are generated from the external clock signal. Thus, contrary to when generating the external clock signals CLK, /CLK, the DRAM controller need not be modified. Furthermore, input pins for additional external clock signals are not necessary.

The improved SDRAM acquires a command and addresses, which are output in synchronism with the rising of the 400 megahertz external clock signal, in accordance with the rising of the first and second internal clock signals. When using an output buffer that receives the first and second internal clock signals alternately and outputs a data signal, the data signal is output in synchronism with the rising of the external clock signal. This causes a circuit delay from when the command is acquired to when the data output circuit is activated. Generally, if the circuit delay takes a single cycle or more of an external clock signal, the activation of the data output circuit by the first and second internal clock signals is further delayed. To compensate for such circuit delay, first and second input internal clock signals and first and second output internal clock signals are generated, and the phases of the first and second output internal clock signals are advanced.

However, such an improved SDRAM still has the shortcomings described below.

(1) It cannot be determined whether the command and the addresses were acquired in accordance with the first input internal clock signal (synchronized at 0°) or the second input internal clock signal (synchronized at 180°). Accordingly, it cannot be determined whether the data signal should be output in accordance with the first output internal clock signal or the second output internal clock signal. As a result, if a command is acquired in accordance with the first input internal clock signal or the second input internal clock signal, the output order of the data may be incorrect. Thus, it must be determined whether commands are acquired in accordance with the first input internal clock signal or the second input internal clock signal so that the data signal is always output at a predetermined timing.

(2) Data having a burst length of 1 causes problems during a read operation. The cycle of an internal clock signal used during processing by the synchronous DRAM is longer than the cycle of a divided external clock signal, which is obtained by dividing the external clock signal by one half. That is, a single cycle of the internal clock signal corresponds to two cycles of the external clock signal. However, the read operation of a data having a burst length of 1 requires a signal having the same frequency as the external clock signal.

(3) The output timing of the read data signal is determined by the first and second output internal clock signals and not the first and second input internal clock signals. This results in a delay in the output of the read data signal. The clock count of the first and second output internal clock signals starts when the command is acquired in accordance with the first and second input clock signals. When the clock count reaches a predetermined value, the read data signal is output. Therefore, for example, if a command is acquired in accordance with the first input internal clock signal and the first output internal clock signal corresponding to that first input internal clock signal has already been output, the output timing is determined by the following or next output internal clock signal. In this case, the read data signal is not output within the predetermined number of cycles. This causes a delay in the output of the read data signal.

SUMMARY OF THE INVENTION

Accordingly, it is a first objective of the present invention to provide a semiconductor memory device that always outputs data signals at a predetermined timing.

It is a second objective of the present invention to provide a semiconductor memory device that guarantees the performance of the read operation when the burst length is 1.

It is a third objective of the present invention to provide a semiconductor memory device that guarantees the output of a data signal within the predetermined clock count from when the command and addresses are acquired.

To achieve the above objectives, the present invention provides a semiconductor memory device including a first output control circuit for receiving a command synchronized with a first input internal clock signal and generating a first output control signal based on the command. A second output control circuit receives the command synchronized with a second input internal clock signal having a phase differing from that of the first input internal clock signal and generates a second output control signal based on the command. An output clock generating circuit is connected to the first and second output control circuits. The output clock generating circuit receives either the first output control signal or the second output control signal, a first output internal clock signal, and a second output internal clock signal. The first and second output internal clock signals have phases that are advanced from those of the first and second input internal clock signals. The output clock generating circuit generates a first output clock signal and a second output clock signal delayed from the first output clock signal. An output buffer is connected to the output clock generating circuit. The output buffer receives a first data signal and a second data signal and outputs the first and second data signals in accordance with the first and second output clock signals.

In a second aspect of the present invention, a semiconductor memory device includes an output control circuit for acquiring a command synchronized with an input internal clock signal and generating an output control signal that determines the output timing of a data signal after a predetermined amount of time elapses from when the command is acquired. An output buffer receives the output control signal to output the data signal in accordance with an output internal clock signal, the phase of which is advanced from that of the input internal clock signal. The output control circuit includes a latency counter that generates the output control signal by counting the cycles of a second output internal clock signal, which is delayed from the first output internal clock signal corresponding to the input internal clock signal when the command is acquired, while compensating for the first output internal clock signal.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 12 is a timing chart showing the operation of the first output CLK control circuit of FIG. 6 and the output CLK generating circuit of FIG. 7.

DETAILED DESCRIPTION OF THE PREFERRED EMBODIMENTS

Figure 1:
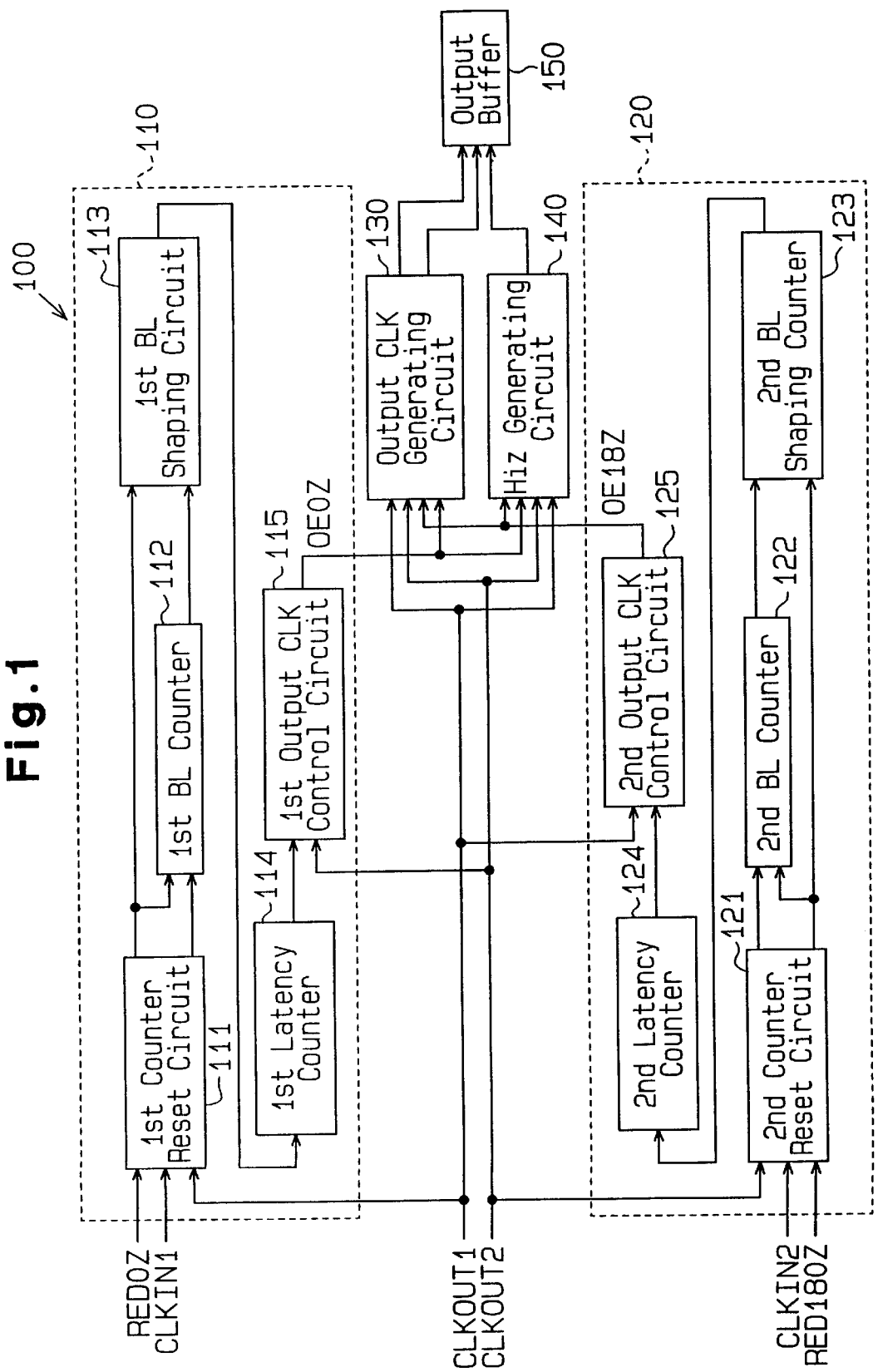
FIG. 1 is a schematic block diagram showing a data output signal circuit of a synchronous DRAM according to a first embodiment of the present invention.

In the drawings, like numerals are used for like elements throughout.

Figure 10:
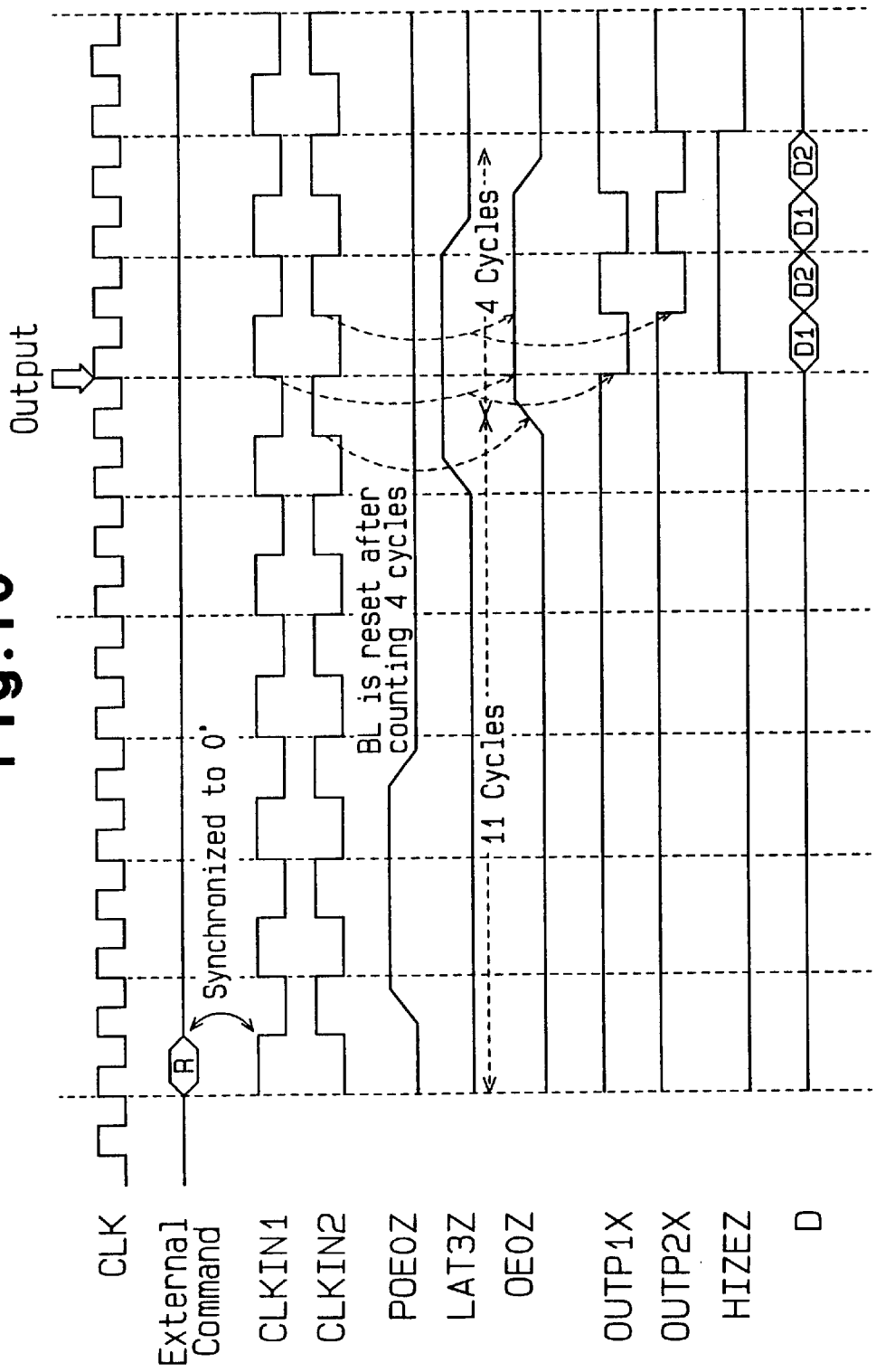
FIG. 10 is a timing chart showing the operation of the data signal output circuit of FIG. 1.
Figure 11:
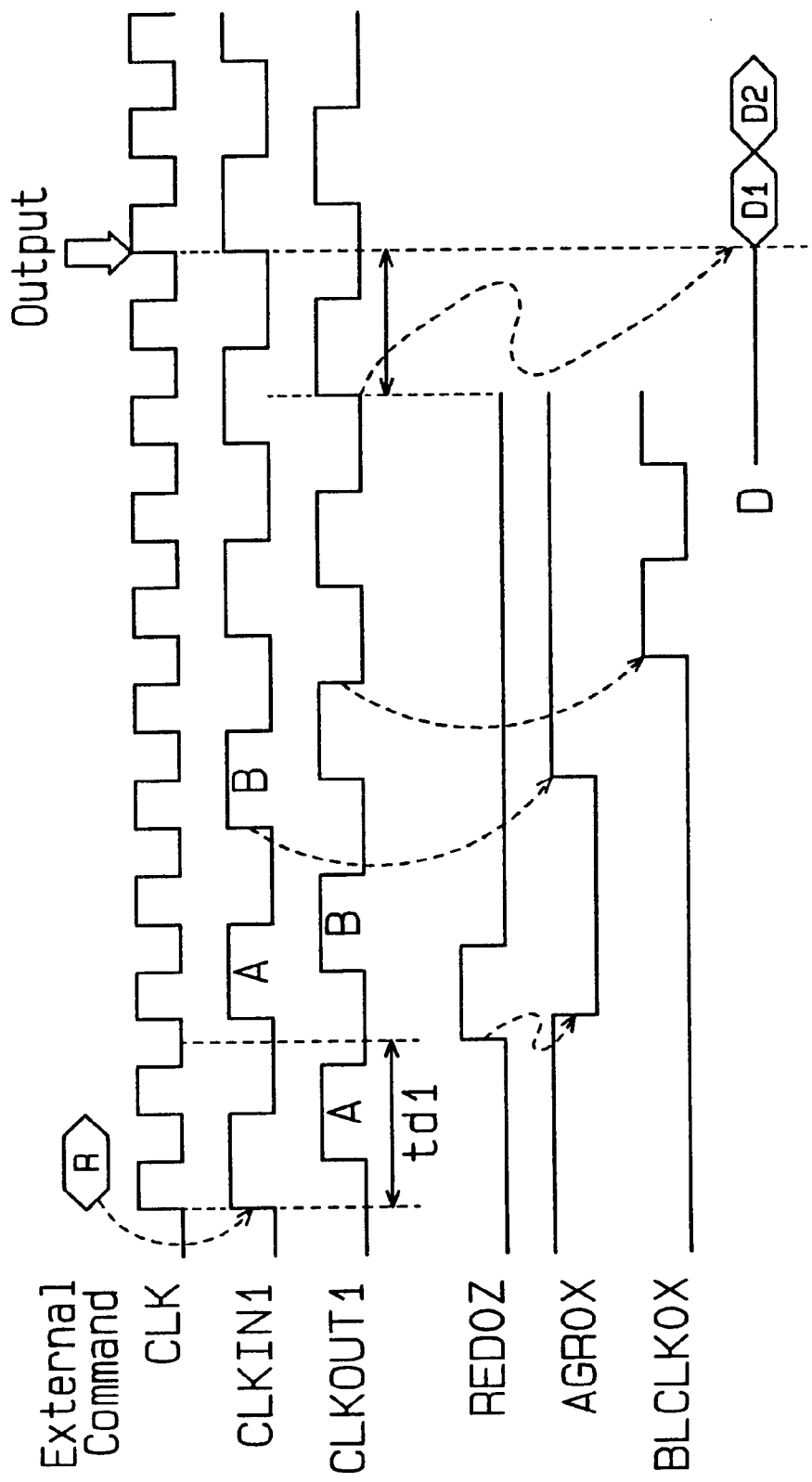
FIG. 11 is a timing chart showing the operation of the first counter reset circuit of FIG. 2.

FIG. 1 is a schematic block diagram showing a data signal output circuit 100 of a synchronous DRAM according to a first embodiment of the present invention. The data signal output circuit 100 receives first and second input internal clock signals CLKIN1, CLKIN2 and first and second output internal clock signals CLKOUT1, CLKOUT2, which are generated by a DLL circuit (not shown). The DLL circuit receives an external clock signal CLK from an external device, or DRAM controller (not shown), and divides the external clock signal CLK by one half to generate the first and second input internal clock signals CLKIN1, CLKIN2 and the first and second output internal clock signals CLKOUT1, CLKOUT2. As shown in FIGS. 10–12, the frequency of the internal clock signals CLKIN1, CLKIN2, CLKOUT1, CLKOUT2 is half that of the external clock signal. For example, if the clock frequency of the external clock signal CLK is 400 megahertz, the clock frequency of the internal clock signals CLKIN1, CLKIN2, CLKOUT1, CLKOUT2 is 200 megahertz.

The first and second input internal clock signals CLKIN1, CLKIN2 are used to determine the timing for acquiring the external command and addresses. The first and second output internal clock signals CLKOUT1, CLKOUT2 are used to determine the output timing of the read data signal.

The first input internal clock signal CLKIN1 has a phase of 0°, while the second input internal clock signal CLKIN2 has a phase of 180°. Thus, as shown in FIG. 10, the first input internal clock signal CLKIN1 and the second input internal clock signal CLKIN2 are offset from each other by half a cycle.

The command and the addresses are output in synchronism with the rising of the 400 megahertz external clock signal and acquired when the first and second input internal clock signals CLKIN1, CLKIN2 rise.

When the external command (in this case, the read command) is acquired in response to the rising of the first input internal clock signal CLKIN1, an internal circuit (not shown) of the DRAM generates a high 0° read command RED0Z. As shown in FIG. 11, the high 0° read command RED0Z is provided to the data signal output circuit 100 after a time td1 elapses from when the read command is acquired in response to the rising of the first input internal clock signal CLKIN1.

When the external command (in this case, the read command) is acquired in response to the rising of the second input enable clock signal CLKIN2, the DRAM internal circuit generates a high 180° read command RED180Z. The high 180° read command RED180Z is provided to the data signal output circuit 100 after a time td1 elapses from when the read command is acquired in response to the rising of the second input internal clock signal CLKIN2.

The first output internal clock signal CLKOUT1 has a phase of 0° and corresponds to the first input internal clock signal CLKIN1. The second output internal clock signal CLKOUT2 has a phase of 180° and corresponds to the second input internal clock signal CLKIN2. Accordingly, the first output internal clock signal CLKOUT1 and the second output internal clock signal CLKOUT2 are offset from each other by half a cycle, as shown in FIG. 12.

Further, the phase of the first output internal clock signal CLKOUT1 is advanced from that of the first input internal clock signal CLKIN1. This is to avoid the output of the data signal using the first input internal clock signal CLKIN1, which is delayed by the circuit delay. Similarly, the phase of the second output internal clock signal CLKOUT2 is advanced from that of the second input internal clock signal CLKIN2.

As shown in FIG. 1, the data signal output circuit 100 includes a first output control circuit 110, a second output control circuit 120, an output clock generating circuit (output CLK generating circuit) 130, a high impedance generating circuit (Hiz generating circuit) 140, and an output buffer 150.

The first output control circuit 110 receives a high 0° read command RED0Z in response to the rising of the first input internal clock signal CLKIN1. In this state, the second output control circuit 120 is deactivated. The second output control circuit 120 receives a high 180° read command RED180Z in response to the rising of the second input internal clock signal CLKIN2. In this state, the first output control circuit 110 is deactivated.

The first output control circuit 110 includes a first counter reset circuit 111, a first burst length counter (first BL counter) 112, a first burst length shaping circuit (first BL shaping circuit) 113, a first latency counter 114, and a first output clock control circuit (first output CLK control circuit) 115.

The second output control circuit 120 includes a second counter reset circuit 121, a second burst length counter (second BL counter) 122, a second burst length shaping circuit (second BL shaping circuit) 123, a second latency counter 124, and a second output clock control circuit (second output CLK control circuit) 125.

The first output control circuit 110 and the second output control circuit 120 perform substantially the same operation. Thus, for the sake of brevity, only the first output control circuit 110 will be described below.

First Counter Reset Circuit 111

Figure 2:
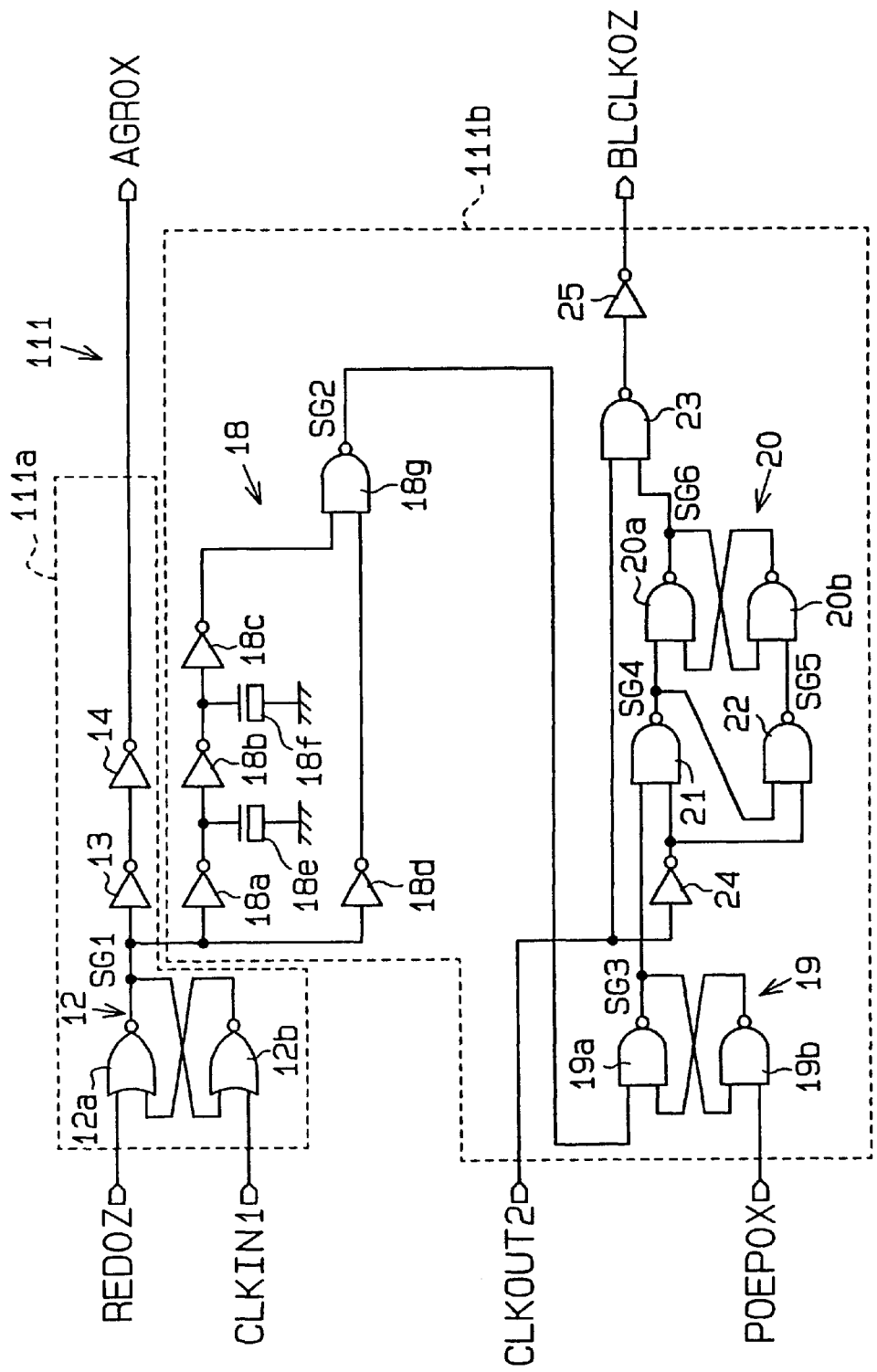
FIG. 2 is a circuit diagram showing a first counter reset circuit of the data signal output circuit of FIG. 1.

FIG. 2 is a circuit diagram showing the first counter reset circuit 111, which includes a first reset signal generating portion 111a and a divided clock generating portion 111b. The reset signal generating portion 111a receives the 0° read command RED0Z and generates a counter reset signal AGR0X. The divided clock generating portion 111b divides the first output internal clock signal CLKOUT1 and generates a divided clock signal BLCLK0Z.

Reset Signal Generating Portion 111a

The reset signal generating portion 111a includes a flip-flop (FF) circuit 12, which has two NOR circuits 12a, 12b, a first inverter 13, and a second inverter 14 connected to the first inverter 13 in series. The reset input terminal (i.e., the input terminal of the NOR circuit 12a) of the first FF circuit 12 is provided with the read command RED0Z and the set input terminal (i.e., the input terminal of the NOR circuit 12b) of the first FF circuit 12 is provided with the first input internal clock signal CLKIN1. The reset output terminal of the first FF circuit 12 (i.e., the output terminal of the NOR circuit 12a) is connected to the input terminal of the first inverter 13.

With reference to FIG. 11, if the 0° read command RED0Z is high, a low output signal SG1 is output from the reset output terminal of the first FF circuit 12, and a low counter reset signal AGR0X is provided to the first BL counter 112 and the first BL shaping circuit 113 via the first and second inverters 13, 14.

The first FF circuit 12 outputs a high output signal SG1 from the reset output terminal in response to a low 0° read command RED0Z and a high first input internal clock CLKIN1. Accordingly, a high counter reset signal AGR0X is output when the first input internal clock CLKIN1 rises.

Divided Clock Generating Portion 111b

The divided clock generating portion 111b includes a delay circuit 18, a second FF circuit 19, a third FF circuit 20, NAND circuits 21–23 and inverters 24, 25.

In response to the falling of the output signal SG1 from the first FF circuit 12, the delay circuit 18 generates an output signal SG2 that falls after a predetermined time td2 elapses. In response to the rising of the output signal SG1 from the first FF circuit 12, the delay circuit 18 outputs an output signal SG2 that rises after a predetermined time td3 elapses.

The delay circuit 18 includes four inverters 18a–18d, two capacitors 18e, 18f, and a NAND circuit 18g. The NAND circuit 18g has a first input terminal connected to the reset output terminal (i.e., the output terminal of the NOR circuit 12a) of the first FF circuit 12 via three of the inverters 18a–18c and a second input terminal connected to the reset output terminal of the first FF circuit 12 via the inverter 18d. The output terminals of the inverters 18a, 18b are grounded by way of the capacitors 18e, 18f, respectively.

When the output signal SG1 of the first FF circuit 12 falls and a high signal is provided to the NAND circuit 18g through the inverters 18a–18c, the output signal SG2 of the NAND circuit 18g falls after the predetermined time td2, which is determined by the inverters 18a–18c and the capacitors 18e, 18f, elapses. When the output signal SG1 of the first FF circuit 12 rises and a low signal is provided to the NAND circuit 18g through the inverter 18d, the output signal SG2 of the NAND circuit 18g rises after the predetermined time td3, which is determined by the inverter 18d, elapses.

The second FF circuit 19 includes two NAND circuits 19a, 19b and has a reset input terminal (i.e., the input terminal of the NAND circuit 19a) to receive the output signal SG2 from the NAND circuit 18g and a set input terminal (i.e., the input terminal of the NAND circuit 19b) to receive a termination signal POEP0X from the first BL shaping circuit 113.

When the output signal SG2 falls, an output signal SG3 generated at the reset output terminal of the second FF circuit 19 (i.e., the output terminal of the NAND circuit 19a) rises. The output signal SG3 remains high until the set input terminal of the second FF circuit 19 (i.e., the input terminal of the NAND circuit 19b) is provided with the termination signal POEP0X.

The NAND circuit 21 has a first input terminal which receives the output signal SG3 from the second FF circuit 19 and a second input terminal which receives the first output internal clock signal CLKOUT1 via the inverter 24. The NAND circuit 21 outputs the first output internal clock signal CLKOUT1 as an output signal SG4 as long as the output signal SG3 remains high (until the second FF circuit 19 is provided with the termination signal POEP0X). When the second FF circuit 19 is set by a low termination signal POEP0X, the NAND circuit 21 holds the output signal SG4 at a high level.

The NAND circuit 22 has a first input terminal which receives the output signal SG4 and a second input terminal which receives the first output internal clock signal CLKOUT1 via the inverter 24. The NAND circuit 22 outputs the first output internal clock signal CLKOUT1 as an output signal SG5 as long as the output signal SG4 remains high (as long as the output signal SG3 from the second FF circuit 19 remains low). When the second FF circuit 19 is reset by a low output signal SG2, the NAND circuit 22 holds the output signal SG5 at a high level.

The third FF circuit 20 includes two NAND circuits 20a, 20b and has a reset input terminal (i.e., the input terminal of the NAND circuit 20a) to receive the output signal SG4 and a set input terminal (i.e., the input terminal of the NAND circuit 20b) to receive the output signal SG5. The falling of the output signal SG4 resets the third FF circuit 20 and causes the reset output terminal (i.e., the output terminal of the NAND circuit 20a) to generate a high output signal SG6. The falling of the output signal SG5 sets the third FF circuit 20 and causes the reset output terminal (i.e., the output terminal of the NAND circuit 20a) to generate a low output signal SG6.

When the output signal SG2 falls and resets the second FF circuit 19 and the first output internal clock signal CLK-OUT1 falls, the third FF circuit 20 is reset causing the output signal SG6 to rise. When the termination signal POEP0X falls and sets the second FF circuit 19 and the first output internal clock signal CLKOUT1 falls, the third FF circuit 20 is set causing the output signal SG6 to fall.

The NAND circuit 23 has a first input terminal which receives the output signal SG6 and a second input terminal which receives the first output internal clock signal CLK-OUT1. The NAND circuit 23 provides the inverter 25 with an inverted first output internal clock signal CLKOUT1 when the output signal SG6 is high. Further, the NAND circuit 23 provides the inverter 25 with a high output signal when the output signal SG6 is low.

The inverter 25 provides the first output internal clock signal CLKOUT1 as the divided clock signal BLCLK0Z when the second and third FF circuits 19, 20 are reset by a low output signal SG2. The divided clock signal BLCLK0Z is generated by the delay circuit 18, the second FF circuit 19, and the third FF circuit 20. Thus, the divided clock signal BLCLK0Z is output after the low counter reset signal AGR0X rises.

The inverter 25 provides the first BL counter 112 with a low signal when the second and third FF circuits 19, 20 are set by the low termination signal POEP0X.

First BL Counter 112

Figure 3:
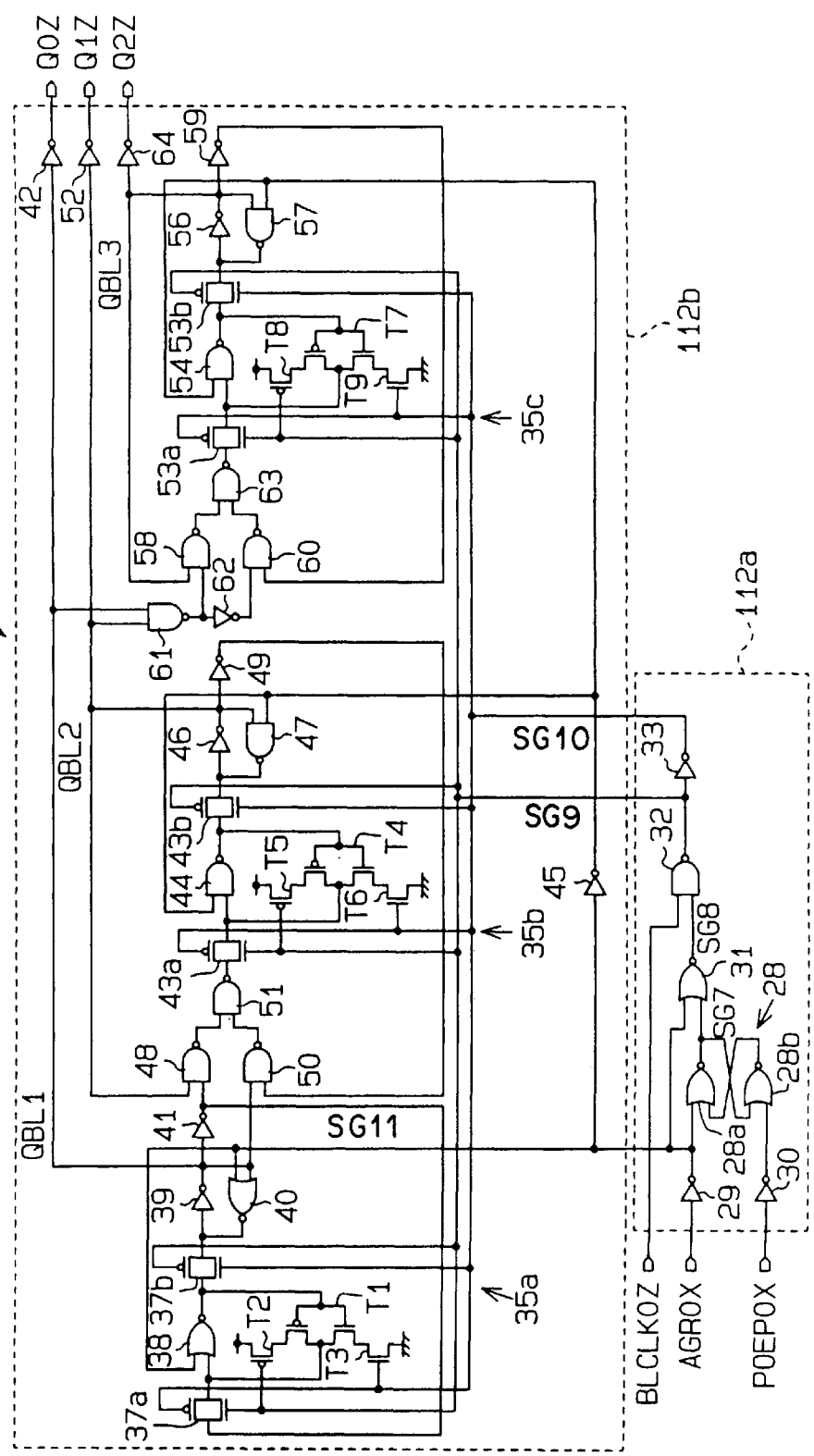
FIG. 3 is a circuit diagram showing a first BL counter of the data signal output circuit of FIG. 1.

FIG. 3 is a circuit diagram showing the first BL circuit 112. The first BL counter 112 starts to count the divided signal BLCLK0Z when the counter reset signal AGR0X rises after falling once and provides the first BL shaping circuit 113 with the counted value as a three bit signal, which includes a first BL signal Q0Z, a second BL signal Q1Z, and a third BL signal Q03. When the first BL counter 112 counts eight pulses of the divided clock signal BLCLK0Z, the BL counter 112 resets the count value and starts counting again.

The first BL counter 112 includes a counter clock generating circuit 112a and a counter circuit 112b. The counter clock generating circuit 112a outputs first and second gate signals SG9, SG10 using the divided clock signal BLCLK0Z from when the counter reset signal AGR0X, which is sent from the first counter reset circuit 111, rises after falling once to when the low termination signal POEP0X is provided.

The counter circuit 112b generates the first, second, and third BL signals Q0Z, Q1Z, Q2Z in accordance with the first and second gate signals SG9, SG10 from the counter clock generating circuit 112a.

Counter Clock Generating Circuit 112a

The counter clock generating circuit 112a includes a fourth FF circuit 28 having two NOR circuits 28a, 28b. The fourth FF circuit 28 has a reset input terminal (the input terminal of the NOR circuit 28a) which receives the counter reset signal AGR0X via an inverter 29 and a set input terminal (the input terminal of the NOR circuit 28b) which receives the termination signal POEP0X from the first BL shaping circuit 113 via an inverter 30.

When the counter reset signal AGR0X falls, the reset output terminal is provided with a low signal and the fourth FF circuit 28 is reset. In the reset state, the fourth FF circuit 28 is set when the termination signal POEP0X falls and the reset terminal is provided with a high signal.

The NOR circuit 31 is connected to the reset output terminal of the fourth FF circuit 28 (i.e., the output terminal of the NOR circuit 28a) and has a first input terminal to receive the output signal SG7 of the fourth FF circuit 28 and a second input terminal to receive the counter reset signal AGR0X via the inverter 29.

Therefore, in the reset state, the NOR circuit 31 outputs a high output signal SG8 when the NOR circuit 31 is provided with a high counter reset signal AGR0X and a low output signal SG7 from the fourth FF circuit 28. In the set state, the NOR circuit 31 outputs a low output signal SG8 regardless of the level of the counter reset signal AGR0X.

In other words, the NOR circuit 31 outputs a high output signal SG8 when the counter reset signal AGR0X rises after the falling of the counter reset signal AGR0X resets the fourth FF circuit 28. When a low termination signal POEP0X sets the fourth FF circuit 28, the output signal SG8 falls.

A NAND circuit 32 has a first input terminal which receives the output signal SG8 from the NOR circuit 31 and a second input terminal which receives the divided clock signal BLCLK0Z from the first counter reset circuit 111. When the output signal SG8 is high, the NAND circuit 32 outputs an inverted divided clock signal BLCLK0Z. The inverted divided clock signal SG8 is inverted by an inverter 33 and provided to the counter circuit 112b as the second gate signal SG10. The inverted divided clock signal from the NAND circuit 32 is provided to the counter circuit 112b as the first gate signal SG9.

The counter clock generating circuit 112a outputs the first and second gate signals SG9, SG10 using the divided clock signal BLCLK0Z from when the counter reset signal AGR0X rises after falling once to when a low termination signal POEP0X sets the fourth FF circuit 28.

Counter Circuit 112b

The counter circuit 112b includes first to third counter portions 35a, 35b, 35c.

First Counter Portion

The first counter portion 35a includes first and second transfer gate circuits 37a, 37b, each of which has a PMOS transistor and an NMOS transistor.

In the first transfer gate circuit 37a, the gate of the PMOS transistor is provided with the second gate signal SG10 and the gate of the NMOS transistor is provided with the first gate signal SG9. In the second transfer gate circuit 37b, the gate of the PMOS transistor is provided with the first gate signal SG9 and the gate of the NMOS transistor is provided with the second gate signal SG10. Thus, the first and second transfer gate circuits 37a, 37b are activated and deactivated alternately in response to the first and second gate signals SG9, SG10.

A NOR circuit 38 has a first input terminal connected to the output terminal of the first transfer gate circuit 37a, a second input terminal to receive the counter reset signal AGR0X via the inverter 29 of the counter clock generating circuit 112a, and an output terminal connected to the input terminal of a CMOS transistor T1. The output terminal of the CMOS transistor is connected to the output terminal of the first transfer gate circuit 37a.

The CMOS transistor T1 includes a PMOS transistor T2 and an NMOS transistor T3, which are connected in series to each other. The PMOS transistor T2 is activated and deactivated in response to the first gate signal SG9. The NMOS transistor T3 is activated and deactivated in response to the second gate signal SG10. Therefore, the CMOS transistor T1 is activated when the first transfer gate 37a is deactivated, and deactivated when the first transfer gate 37a is activated.

The NOR circuit 38 and the CMOS transistor T1 form a latch circuit. When the counter reset signal AGR0X falls, the output signal of the NOR circuit 38 falls. Activation of the CMOS transistor T1 (i.e., deactivation of the first transfer gate circuit 37a) causes the CMOS transistor T1 to receive a low signal from the NOR circuit 38 and provide a high output signal to the NOR circuit 38. Thus, the NOR circuit 38 holds the output of the low signal based on the counter reset signal AGR0X being low. The NOR circuit 38 holds the output of the high signal in response to the high counter reset signal AGR0X and a low reset signal SG11 from the first transfer gate circuit 37a.

The output signal of the NOR circuit 38 is provided to an inverter 39 through the second transfer gate circuit 37b. A NOR circuit 40 has a first input terminal connected to the output terminal of the inverter 39, a second input terminal which receives the counter reset signal AGR0X via the inverter 29, and an output terminal connected to the input terminal of the inverter 39.

The inverter 39 and the NOR circuit 40 form a latch circuit. When the counter reset signal AGR0X falls (i.e., when the NOR circuit 40 is provided with a high signal), the NOR circuit 40 outputs a low signal. Since the second transfer gate circuit 37b is deactivated in this state, the inverter 39 outputs a high signal. The output signal of the inverter 39 falls when the second transfer gate circuit 37b is activated and a high signal is output by the NOR circuit 38.

The output signal of the inverter 39 is output to the first transfer gate circuit 37a via an inverter 41. That is, the inverter 41 provides the first transfer gate circuit 37a with a low reset signal SG11 when receiving a low counter reset signal AGR0X. The low reset signal SG11 is provided to the NOR circuit 38 when the first transfer gate circuit 37a is activated.

In the first counter portion 35a, when a low counter reset signal AGR0X is output, the NOR circuit 38 holds the output of a low signal and the inverter 39 holds the output of a high signal. After the counter reset signal AGR0X rises, the first transfer gate circuit 37a is deactivated and the second transfer gate circuit 37b is activated in response to the first and second gate signals SG9, SG10. This causes the high output signal held by the NOR circuit 38 to be provided to the inverter 39 and a high reset signal SG11 to be output from the inverter 41 via the inverter 39.

Afterward, the first transfer gate circuit 37a is activated and the second transfer gate circuit 37b is deactivated in response to the first and second gate signals SG9, SG10 causing the NOR circuit 38 to output a low signal. Subsequently, the first transfer gate circuit 37a is deactivated and the second transfer gate circuit 37b is activated in response to the first and second gate signals SG9, SG10 causing the inverter 39 to output a high signal. An output signal QBL1 from the inverter 39 is provided to an inverter 42. The inverter 42 provides the first BL signal Q0Z to the first BL shaping circuit 113.

The first counter section 35a outputs a low first BL signal Q0Z in response to a low counter reset signal AGR0X. When the second transfer gate 37b is activated in response to the first and second gate signals SG9, SG10, the first counter section 35a outputs a high first BL signal Q0Z. The first BL signal Q0Z is inverted each time the second transfer gate circuit 37b is activated.

Second Counter Portion

The second counter portion 35b includes third and fourth transfer gate circuits 43a, 43b, each of which has a PMOS transistor and an NMOS transistor.

In the third transfer gate circuit 43a, the gate of the PMOS transistor is provided with the second gate signal SG10 and the gate of the NMOS transistor is provided with the first gate signal SG9. In the fourth transfer gate circuit 43b, the gate of the PMOS transistor is provided with the first gate signal SG9 and the gate of the NMOS transistor is provided with the second gate signal SG10. Thus, the third and fourth transfer gate circuits 43a, 43b are activated and deactivated alternately in response to the first and second gate signals SG9, SG10.

A NAND circuit 44 has a first input terminal connected to the output terminal of the third transfer gate circuit 43a, a second input terminal to receive the counter reset signal AGR0X via the inverters 29, 45, and an output terminal connected to the input terminal of a CMOS transistor T4. The output terminal of the CMOS transistor T4 is connected to the output terminal of the third transfer gate circuit 43a.

The CMOS transistor T4 includes a PMOS transistor T5 and an NMOS transistor T6, which are connected in series to each other. The PMOS transistor T5 is activated and deactivated in response to the first gate signal SG9. The NMOS transistor T6 is activated and deactivated in response to the second gate signal SG10. Therefore, the CMOS transistor T4 is activated when the third transfer gate 43a is deactivated, and deactivated when the third transfer gate 43a is activated.

The NAND circuit 44 and the CMOS transistor T4 form a latch circuit. When the counter reset signal AGR0X falls, the NAND circuit 44 outputs a high signal. Activation of the CMOS transistor T4 (i.e., deactivation of the third transfer gate circuit 43a) causes the CMOS transistor T4 to receive a high signal from the NAND circuit 44 and provide a low signal to the NAND circuit 38. Thus, the NAND circuit 44 holds the output of the high signal based on the low counter reset signal AGR0X.

When the counter reset signal AGR0X rises and the NAND circuit 44 receives a high signal via the third transfer gate circuit 43a, the NAND circuit 44 holds the output of the low signal.

The output signal of the NAND circuit 44 is provided to an inverter 46 via the fourth transfer gate circuit 43b. A NAND circuit 47 has a first input terminal connected to the output terminal of the inverter 46, a second input terminal which receives the counter reset signal AGR0X via the inverters 29, 45, and an output terminal connected to the input terminal of the inverter 46.

The inverter 46 and the NAND circuit 47 form a latch circuit. When the counter reset signal AGR0X falls (i.e., when the NAND circuit 47 is provided with a low signal), the NAND circuit 47 outputs a high signal. Since the fourth transfer gate circuit 43b is deactivated in this state, the inverter 46 outputs a low signal.

When the fourth transfer gate circuit 43b is activated and the NAND circuit 44 outputs a low signal, the inverter 46 outputs a high signal.

A NAND circuit 48 has a first input terminal which receives the output signal from the inverter 46 and a second input terminal which receives the reset signal SG11 from the first counter portion 35a. A NAND circuit 50 has a first input terminal which receives the output signal from the inverter 46 via the inverter 49 and a second input terminal which receives the output signal QBL1 from the first counter portion 35a.

A NAND circuit 51 has a first input terminal and a second input terminal which receive the output signals from the NAND circuits 48, 50, respectively, and an output terminal connected to the input terminal of the third transfer gate circuit 43a.

When the counter reset signal AGR0X falls, the inverter 46 outputs a low signal and the NAND circuit 44 outputs a high signal. When the counter reset signal AGR0X rises, the NAND circuit 44 outputs a low signal and the NAND circuit 48 outputs a high signal in response to the low signal from the inverters 41, 46. When the output signal QBL1 and the output signal from the inverter 49 rise, the NAND circuit 50 outputs a low signal. The NAND circuit 51 outputs a high signal in response to the low signals from the NAND circuits 48, 50. As a result, when the transfer gate circuit 43b is activated in response to the first and second gate signals SG9, SG10, the inverter 46 receives a low signal from the NAND circuit 44 and outputs a high signal. Afterward, the inverter 46 continues to output the high signal as long as the NAND circuit 51 continues to output the high signal even if the third and fourth transfer gates 43a, 43b are activated and deactivated alternately.

Subsequently, when the output signal QBL1 of the first counter portion 35a falls, the NAND circuit 51 outputs a low signal, the third transfer gate circuit 43a is activated, and the NAND circuit 44 outputs a high signal. This activates the fourth transfer gate circuit 43b and causes the inverter 46 to output a low signal. The output signal QBL2 of the inverter 46 is provided to the inverter 52. The inverter 52 provides the second BL1 signal to the first BL shaping circuit 113.

The second BL signal Q1Z is set at a high level when a low counter reset signal AGR0X is provided. The second BL signal Q1Z is set at a low level when the fourth transfer gate 43b is activated in response to the first and second gate signals SG9, SG10.

After a high first BL signal Q0Z is output, activation of the third transfer gate circuit 43a and the fourth transfer gate 43b causes the second BL signal Q1Z to become high. In other words, the second BL signal Q1Z is inverted each time the first BL signal Q0Z rises.

Third Counter Portion

The third counter portion 35c includes fifth and sixth transfer gates 53a, 53b, each of which has a PMOS transistor and an NMOS transistor.

In the fifth transfer gate circuit 53a, the gate of the PMOS transistor is provided with the second gate signal SG10 and the gate of the NMOS transistor is provided with the first gate signal SG9. In the sixth transfer gate circuit 53b, the gate of the PMOS transistor is provided with the first gate signal SG9 and the gate of the NMOS transistor is provided with the second gate signal SG10. Thus, the fifth and sixth transfer gate circuits 53a, 53b are activated and deactivated alternately in response to the first and second gate signals SG9, SG10.

A NAND circuit 54 has a first input terminal connected to the output terminal of the fifth transfer gate circuit 53a, a second input terminal which receives the counter reset signal AGR0X via the inverter 29 and the inverter 45, and an output terminal connected to the input terminal of a CMOS transistor T7. The output terminal of the CMOS transistor T7 is connected to the output terminal of the fifth transfer gate circuit 53a.

The CMOS transistor T7 includes a PMOS transistor T8 and an NMOS transistor T9, which are connected in series to each other. The PMOS transistor T8 is activated and deactivated in response to the first gate signal SG9. The NMOS transistor T9 is activated and deactivated in response to the second gate signal SG10. Therefore, the CMOS transistor T7 is activated when the fifth transfer gate 53a is deactivated, and deactivated when the fifth transfer gate 53a is activated.

The NAND circuit 54 and the CMOS transistor T7 form a latch circuit. When the counter reset signal AGR0X falls, the NAND circuit 54 outputs a high signal. Activation of the CMOS transistor T8 (i.e., deactivation of the fifth transfer gate circuit 53a) causes the CMOS transistor T7 to provide a low signal to the NAND circuit 54 in response to the high signal from the NAND circuit 54. Thus, the NAND circuit 54 holds the output of the high signal.

When the counter reset signal AGR0X rises and the NAND circuit 54 receives a high signal from the fifth transfer gate circuit 53a, the NAND circuit 54 outputs a low signal. On the other hand, when the counter reset signal AGR0X rises and the NAND circuit 54 receives a low signal from the fifth transfer gate circuit 53a, the NAND circuit 54 holds the output of a high signal.

An inverter 56 receives the output signal of the NAND circuit 54 via the sixth transfer gate circuit 53b. A NAND circuit 57 includes a first input terminal connected to the output terminal of the inverter 56, a second input terminal which receives the counter reset signal AGR0X via the inverters 29, 45, and an output terminal connected to the input terminal of the inverter 56.

The inverter 56 and the NAND circuit 57 form a latch circuit. When the counter reset signal AGR0X falls (i.e., when the NAND circuit 57 is provided with a low signal), the NAND circuit 57 outputs a high signal. Since the sixth transfer gate circuit 53b is deactivated in this state, the inverter 56 outputs a low signal. When the sixth transfer gate circuit 53b is activated, the inverter 56 outputs a high signal in response to a low signal from the NAND circuit 54.

A NAND circuit 58 has a first input terminal which receives the output signal from the inverter 56 and a second input terminal which receives the output signal from a NAND circuit 61. The NAND circuit 61 has a first input terminal to receive the output signal QBL1 from the first counter 35a and a second input terminal to receive the output signal QBL2 from the second counter portion 35b. Thus, when the output signals QBL1, QBL2 are both high, the NAND circuit 61 provides a low signal to the NAND circuit 58.

A NAND circuit 60 has a first input terminal connected to the inverter 56 via an inverter 59 and a second input terminal connected to the NAND circuit 61 via an inverter 62. A NAND circuit 63 receives output signals from the NAND circuits 58, 60 and provides an output signal to the fifth transfer gate circuit 53a.

When the counter reset signal AGR0X falls, the inverter 56 outputs a low signal, the NAND circuit 54 outputs a high signal, the output signal QBL1 rises, the output signal QBL2 falls, and the NAND circuit 61 provides a high signal to the NAND circuit 58. As a result, the NAND circuit 58 outputs a high signal, the NAND circuit 60 outputs a low signal, and the NAND circuit 63 outputs a high signal.

Activation of the sixth transfer gate circuit 53b in response to the first and second gate signals SG9, SG10 causes the inverter 56 to invert the low signal from the NAND circuit 54. An inverter 64 receives the output signal QBL3 from the inverter 56 and provides the third BL signal Q2Z to the first BL shaping circuit 113.

The third BL signal Q2Z is set at a high level when a low counter reset signal AGR0X is output. When the output signals QBL1, QBL2 are both high and the fourth and sixth transfer gate circuits 53a, 53b are activated, the third BL signal Q2Z becomes low. That is, the third BL signal Q2Z is inverted each time the first BL signal Q0Z and the second BL signal Q1Z become low.

First BL Shaping Circuit 113

Figure 4:
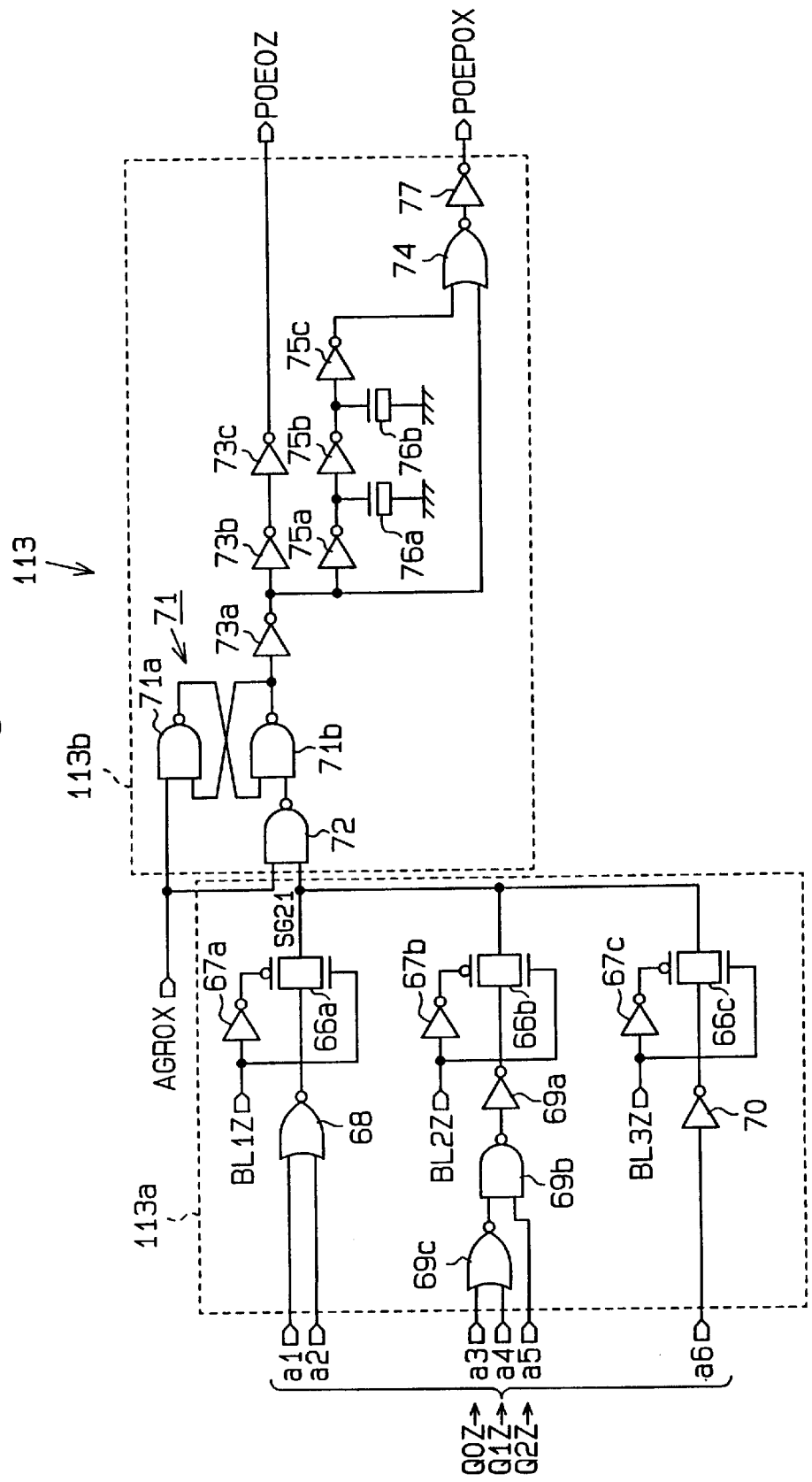
FIG. 4 is a circuit diagram showing a first BL shaping circuit of the data signal output circuit of FIG. 1.

FIG. 4 is a circuit diagram showing the first BL shaping circuit 113. The first BL shaping circuit 113 generates a shaping signal POE0Z that rises in response to the falling of the counter reset signal AGR0X and falls after counting the number of pulses of the divided clock signal BLCLK0Z that correspond to the predetermined burst length. When the shaping signal POE0Z falls, the first BL shaping circuit 113 generates a termination signal POEP0X that is held at a low level for a predetermined period of time.

The first BL shaping circuit 113 includes a burst length setting circuit 113a and a burst waveform shaping circuit 113b.

Burst Length Setting Circuit 113a

The burst length setting circuit 113a includes seventh, eighth, and ninth transfer gates 66a, 66b, 66c, each of which has a PMOS transistor and an NMOS transistor. An inverter 67a connected to the NMOS and PMOS transistor gates of the seventh transfer gate circuit 66a is provided with a first burst length mode signal BL1Z. An inverter 67b connected to the NMOS and PMOS transistor gates of the eighth transfer gate circuit 66b is provided with a second burst length mode signal BL2Z. An inverter 67c connected to the NMOS and PMOS transistor gates in the ninth transfer gate circuit 66c is provided with a third burst length mode signal BL3Z.

The first to third burst length mode signals BL1Z, BL2Z, BL3Z are burst length selection signals set in accordance with output signals from a DRAM controller. For example, when the burst length is 4, only the first burst length mode signal BL1Z is set at a high level, and the seventh transfer gate circuit 66a is activated while the eighth and ninth transfer gate circuits 66b, 66c are deactivated.

If the burst length is 8, only the second burst length signal BL2Z is set at a high level, and the eighth transfer gate circuit 66b is activated while the seventh and ninth transfer gate circuits 66a, 66c are deactivated.

When the burst length is 1 or 2, the third burst length mode signal BL3Z is set at a high level, and the ninth transfer gate circuit 66c is activated while the seventh and eighth transfer gate circuits 66a, 66b are deactivated.

A NOR circuit 68 has input terminals which receive first and second control signals a1, a2 and an output terminal connected to the input terminal of the seventh transfer gate circuit 66a. The first and second control signals a1, a2 are generated based on the first, second, and third BL signals Q0Z, Q1Z, Q2Z and are both set at a low level when four pulses of the divided clock signal BLCLK0Z are counted.

Therefore, when the first BL counter 112 counts four divided clock signals BLCLK0Z, the NOR circuit 68 outputs a high signal. As a result, the seventh transfer gate circuit 66a is activated and a count-up signal SG21 is provided to the burst waveform shaping circuit 113b.

A NAND circuit 69b has a first input terminal which receives a fifth control signal a5, a second input terminal which receives an output signal from a NOR circuit 69c, and an output terminal connected to the input terminal of the eighth transfer gate circuit 66b via an inverter 69a. The NOR circuit 69c has a first input terminal which receives a third control signal a3 and a second input terminal which receives a fourth control signal a4.

The third to fifth control signals a3–a5 are generated based on the first, second, and third BL signals Q0Z, Q1Z, Q2Z. When eight pulses of the divided clock signal BLCLK0Z are counted by the first BL counter 112, the third and fourth control signals a3, a4 are set at a low level and the fifth control signal a5 is set at a high level.

Therefore, when the first BL counter 112 counts eight divided clock signals BLCLK0Z, the inverter 69a outputs a high signal. As a result, the eighth transfer gate circuit 66b is activated and the count-up signal SG21 is provided to the burst waveform shaping circuit 113b.

The input terminal of the ninth transfer gate circuit 66c is provided with a sixth control signal a6 via an inverter 70. The sixth control signal a6 is generated based on the first, second, and third BL signals Q0Z, Q1Z, Q2Z and is set at a low level when one clock of the divided clock signal BLCLK0Z is counted by the first BL counter 112.

Therefore, when the first BL counter 112 counts one divided clock signal BLCLK0Z, the inverter 70 outputs a high signal. As a result, the ninth transfer gate circuit 66c is activated and the count-up signal SG21 is provided to the burst waveform shaping circuit 113b.

When the burst length is set at 4, a high count-up signal SG21 is output after the first BL counter 112 counts four pulses of the divided clock signal BLCLK0Z. If the burst length is set at 8, a high count-up signal SG21 is output after the first BL counter 112 counts eight pulses of the divided clock signal BLCLK0Z. Furthermore, if the burst length is set at 1 or 2, a high count-up signal SG21 is output after the first BL counter 112 counts one clock of the divided clock signal BLCLK0Z.

Burst Waveform Shaping Circuit 113b

The burst waveform shaping circuit 113b includes a fifth FF circuit 71 having two NAND circuits 71a, 71b. The fifth FF circuit 71 has a reset input terminal (the input terminal of the NAND circuit 71a) which receives the counter reset signal AGR0X and a set input terminal (the input terminal of the NAND circuit 71b) which receives the output signal from a NAND circuit 72. The NAND circuit 72 has an input terminal for receiving the counter reset signal AGR0X and a further input terminal for receiving the count-up signal SG21 from the burst length setting circuit 113a. When the count-up signal SG21 and the counter reset signal AGR0X fall, the fifth FF circuit 71 outputs a low signal from the set output terminal (the output terminal of the NAND circuit 71b). Afterward, when the counter reset signal AGR0X rises, the fifth FF circuit 71 does not perform the inverting operation and keeps the output of the signal low. If the count-up signal SG21 rises in this state, the NAND circuit 72 outputs a low signal, the fifth FF circuit 71 performs the inverting operation, and a high signal is output from the set output terminal.

The output signal from the set output terminal of the fifth FF circuit 71 is provided to the first latency counter 114 via three inverters 73a, 73b, 73c as the shaping signal POE0Z. Thus, the shaping signal POE0Z rises when the counter reset signal AGR0X falls, and falls when the count-up signal SG21 rises.

A NOR circuit 74 has a first input terminal for receiving the output signal of the inverter 73a and a second input terminal for receiving the output signal of three inverters 75a, 75b, 75c. The inverters 75a, 75b, 75c form a delay circuit. The output terminals of the inverters 75a, 75b are grounded via capacitors 76a, 76b.

Therefore, the NOR circuit 74 outputs a high signal when the output signal of the inverter 75a falls and outputs a low signal after a time delay td4, determined by the inverters 75a, 75b, 75c, elapses. The output signal of the NOR circuit 74 is provided to the counter clock generating circuit 112a and the divided clock generating portion 111b. That is, the termination signal POEP0X remains low during the delay time td4 when the shaping signal POE0Z falls.

First Latency Counter 114

Upon receipt of a high shaping signal POE0Z from the first BL shaping circuit 113, the first latency counter 114 counts the pulses of the external clock signal CLK during acquisition of the read command. When the count value reaches a predetermined value, the first latency counter 114 generates three types of late signals LAT1Z, LAT2Z, LAT3Z which are used to output a read data signal D. The first late signal LAT1Z is used to output the read signal D after eight pulses of the external clock signal CLK are counted. The second late signal LAT2Z is used to output the read signal D after ten pulses of the external clock signal CLK are counted. The third late signal LAT3Z is used to output the read signal D after twelve pulses of the external clock signal CLK are counted.

Figure 5:
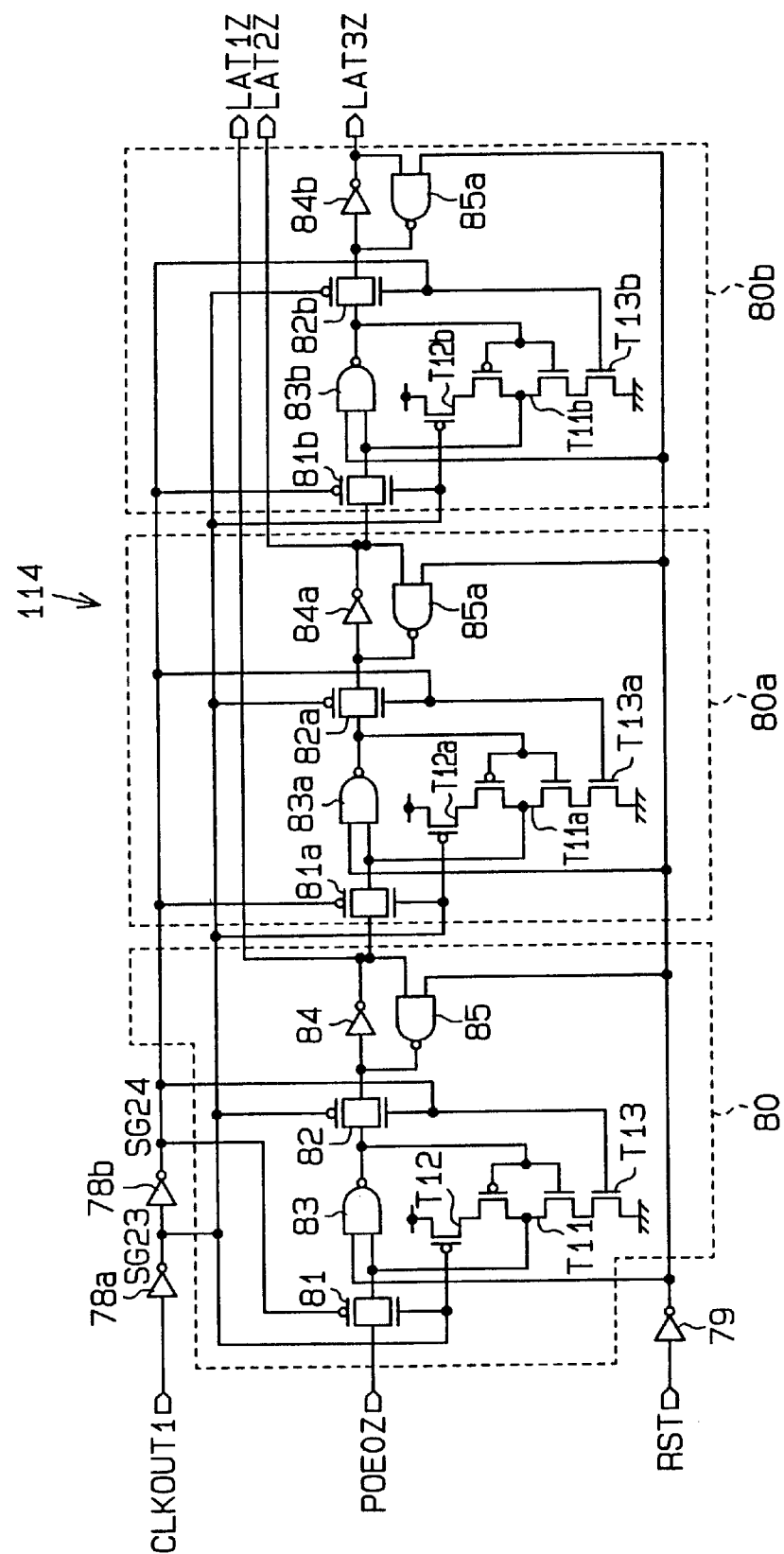
FIG. 5 is circuit diagram showing a first latency counter circuit of the data signal output circuit of FIG. 1.

FIG. 5 is a circuit diagram showing the first latency counter 114. The first latency counter 114 includes an inverter 78a that receives the first output internal clock signal CLKOUT1 and generates a third gate signal SG23, an inverter 18b that receives the third gate signal SG23 from the inverter 78a and generates a fourth gate signal SG24, and an inverter 79 that receives a signal reset signal RST, which is output when the power is turned on. The third gate signal SG23, the fourth gate signal SG24, and the reset signal RST are provided to first, second, and third counter portions 80, 80a, 80b. Since each of the counter portions 80, 80a, 80b have the same circuit structure, only the first counter portion 80 will be described. In the second counter portion 80a, devices that are the same or similar to corresponding devices in the first counter portion 80 are denoted with the same reference numeral followed by the letter "a". In the third counter portion 80b, devices that are the same or similar to corresponding devices in the first counter portion 80 are denoted with the same reference numeral followed by the letter "b".

First Counter Portion 80

The first counter portion 80 includes a first transfer gate circuit 81 and a second transfer gate circuit 82, each of which has a PMOS transistor and an NMOS transistor.

In the first transfer gate circuit 81, the gate of the PMOS transistor is provided with the fourth gate signal SG24 and the gate of the NMOS transistor is provided with the third gate signal SG23. In the second transfer gate circuit 82, the gate of the PMOS transistor is provided with the third gate signal SG23 and the gate of the NMOS transistor is provided with the fourth gate signal SG24. Accordingly, the first and second transfer gate circuits 81, 82 are activated and deactivated alternately by the third and fourth gate signals SG23, SG24.

A NAND circuit 83 has a first input terminal for receiving the shaping signal POE0Z from the first BL shaping circuit 113 via the first transfer gate circuit 81, a second input terminal for receiving the reset signal RST via the inverter 79, and an output terminal connected to the input terminal of a CMOS transistor T11. The output terminal of the CMOS transistor T11 is connected to the output terminal of the first transfer gate circuit 81 and the first input terminal of the NAND circuit 83.

The CMOS transistor T11 includes a PMOS transistor T12 and an NMOS transistor T13, which are connected in series to each other. The PMOS transistor T12 is activated and deactivated in response to the third gate signal SG23. The NMOS transistor T13 is activated and deactivated in response to the fourth gate signal SG24. Accordingly, deactivation of the first transfer gate 81 activates the CMOS transistor T11 and activation of the first transfer gate 81 deactivates the CMOS transistor T11.

The NAND circuit 83 and the CMOS transistor T11 form a latch circuit. When the reset signal RST rises, the NAND circuit 83 outputs a high signal and the CMOS transistor T11 provides a low signal to the NAND circuit 83. The first transfer gate circuit 81 is deactivated in this state. Thus, the NAND circuit 83 holds the output of the high signal. When the first transfer gate circuit 81 is activated and a high shaping signal POE0Z is provided to the NAND circuit 83, the output signal of the NAND circuit 83 is inverted. The output of the NAND circuit 83 is held at the low level while the high shaping signal POE0Z is provided.

The output signal of the NAND circuit 83 is provided to an inverter 84 via the second transfer gate circuit 82. The NAND circuit 85 has a first input terminal connected to the output terminal of the inverter 84, a second input terminal for receiving the reset signal RST via the inverter 79, and an output terminal connected to the input terminal of the inverter 84 and the output terminal of the second transfer gate circuit 82.

The inverter 84 and the NAND circuit 85 form a latch circuit. When the reset signal RST falls, the NAND circuit 85 outputs a high signal and the inverter 84 outputs a low signal. In this state, if a low signal is provided to the inverter 84 from the NAND circuit 83 via the second transfer gate circuit 82, the inverter 84 outputs a high signal.

In the first counter portion 80, if the reset signal RST is active and the shaping signal POE0Z rises, the high shaping signal POE0Z is acquired when the second transfer gate circuit 81 is activated. Afterward, activation of the second transfer gate circuit 82 causes a high shaping circuit POE0Z to be provided as the first late signal LAT1Z to a first transfer gate circuit 81a of the second counter portion 80a from the inverter 84.

In the second counter portion 80a, the first late signal LAT1Z is acquired when the second transfer gate circuit 81a is activated. Afterward, activation of the second transfer gate circuit 82a causes the second late signal LAT2Z (shaping signal POE0Z) to be provided to a first transfer gate circuit 81b of the third counter portion 80b via an inverter 84a.

In the third counter portion 80b, the second late signal LAT2Z is acquired when the second transfer gate circuit 81b is activated. Afterward, activation of the second transfer gate circuit 82b causes the third late signal LAT3Z (shaping signal POE0Z) to be output.

The relationship of the first to third late signals LAT1Z, LAT2Z, LAT3Z and the shaping signal POE0Z is described below.

The first late signal LAT1Z has a phase that is delayed from the shaping signal POE0Z by a cycle and a half of the first output internal clock signal CLKOUT1. In other words, when the shaping signal POE0Z rises, the first late signal LAT1Z rises in synchronism with the falling of the first cycle of the first output internal clock signal CLKOUT1.

The second late signal LAT2Z has a phase that is delayed from the shaping circuit POE0Z by two and one-half cycles of the first output internal clock signal CLKOUT1. In other words, when the shaping signal POE0Z rises, the second late signal LAT2Z rises in synchronism with the falling of the second cycle of the first output internal clock signal CLK-OUT1.

The third late signal LAT3Z has a phase that is delayed from the shaping circuit POE0Z by three and one-half cycles of the first output internal clock signal CLKOUT1. In other words, when the shaping signal POE0Z rises, the third late signal LAT3Z rises in synchronism with the falling of the third cycle of the first output internal clock signal CLK-OUT1.

The counter portions 80, 80*a*, 80*b* generate the late signals by counting the pulses of the first output internal clock signal CLKOUT1. The first output internal clock signal CLK-OUT1 is advanced from the phase of a first input internal clock signal CLKIN1. Thus, the first output internal clock signal CLKOUT1 corresponding to first input internal clock signal CLKIN1 that acquires the read command has already been output. As a result, the first latency counter 114 performs the counting operation in accordance with a new first output internal clock signal CLKOUT1 corresponding to a new first input internal clock signal CLKIN1 subsequent to the first internal clock signal CLKIN1 that acquires the read command.

Therefore, the first late signal LAT1Z rises after five cycles of the external clock signal CLK are counted. The second late signal LAT2Z rises after seven cycles of the external clock signal CLK are counted. The third late signal LAT3Z rises after nine cycles of the external clock signal CLK are counted.

First Output CLK Control Circuit 115

The first output CLK control circuit 115 selects one of the first to third late signals LAT1Z, LAT2Z, LAT3Z in accordance with first to third mode signals MDL1Z, MDL2Z, MDL3Z. The first output CLK control circuit 115 then generates an output control signal OE0Z by shifting the selected late signal by two cycles of the external clock signal CLK. The output control signal OE0Z related to the first late signal LAT1Z rises after seven cycles of the external clock signal CLK are counted. The output control signal OE0Z related to the second late signal LAT2Z rises after nine cycles of the external clock signal CLK are counted. The output control signal OE0Z related to the third late signal LAT3Z rises after eleven cycles of the external clock signal CLK are counted.

Figure 6:
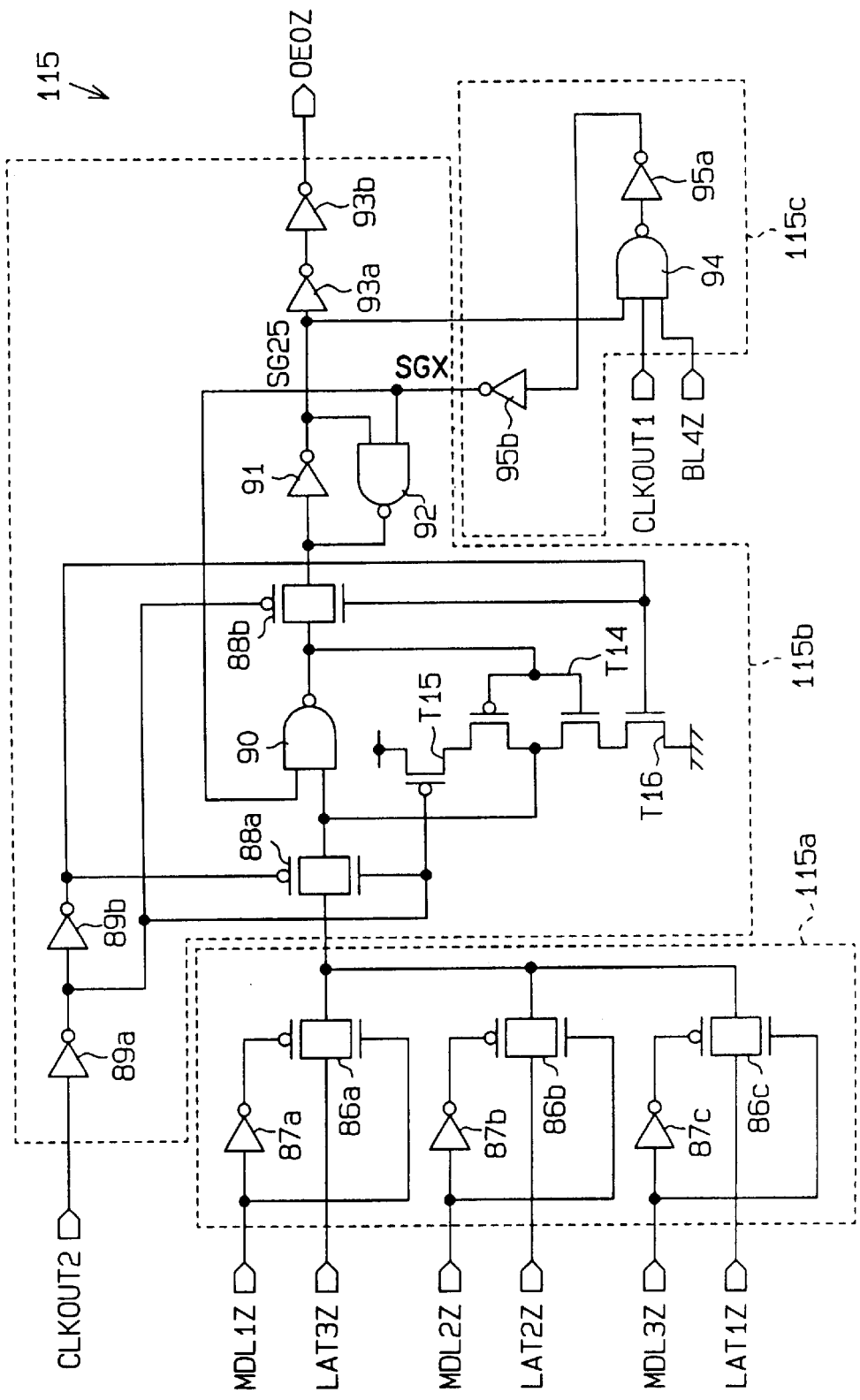
FIG. 6 is a circuit diagram showing a first output CLK control circuit of the data signal output circuit of FIG. 1.

FIG. 6 is a circuit diagram showing the first output CLK control circuit 115. The first output CLK control circuit 115 includes a mode setting circuit 115*a*, an output control signal generating circuit 115*b*, and a burst waveform altering circuit 115*c*.

Mode Setting Circuit 115*a*

The mode setting circuit 115*a* includes eleventh, twelfth, and thirteenth transfer gate circuits 86*a*, 86*b*, 86*c*, each of which has a PMOS transistor and an NMOS transistor.

The input terminal of an inverter 87*a* connected to the gates of the NMOS and PMOS transistors of the eleventh transfer gate circuit 86*a* is provided with the first mode signal MDL1Z. The input terminal of an inverter 87*b* connected to the gates of the NMOS and PMOS transistors of the twelfth transfer gate circuit 86*b* is provided with the second mode signal MDL2Z. The input terminal of an inverter 87*c* connected to the gates of the NMOS and PMOS transistors of the thirteenth transfer gate circuit 86*c* is provided with the third mode signal MDL3Z.

The first to third mode signals MDL1Z, MDL2Z, MDL3Z are used to select the output timing of the shaping signal POE0Z, or one of the first to third late signals LAT1Z, LAT2Z, LAT3Z, based on signals output by the DRAM controller. The first mode signal MDL1Z is used to output the read data signal D after counting eight cycles of the external clock signal CLK during acquisition of the read command. The second mode signal MDL2Z is used to output the read data signal D after counting ten cycles of the external clock signal CLK during acquisition of the read command. The third mode signal MDL3Z is used to output the read data signal D after counting twelve cycles of the external clock signal CLK during acquisition of the read command.

In the preferred and illustrated embodiment, when the third late signal LAT3Z is selected, only the first mode signal MDL1Z rises. In this state, only the eleventh transfer gate circuit 86*a* is activated, and the twelfth and thirteenth transfer gate circuits 86*b*, 86*c* are deactivated.

When the second late signal LAT2Z is selected, only the second mode signal MDL2Z rises. In this state, only the twelfth transfer gate circuit 86*b* is activated, and the eleventh and thirteenth transfer gate circuits 86*a*, 86*c* are deactivated.

Further, when the first late signal LAT1Z is selected, only the third mode signal MDL3Z rises. In this state, only the thirteenth transfer gate circuit 86*c* is activated, and the eleventh and twelfth transfer gate circuits 86*a*, 86*b* are deactivated.

Output Control Signal Generating Circuit 115*b*

The output control signal generating circuit 115*b* includes a first transfer gate circuit 88*a* and a second transfer gate circuit 88*b*, each of which has a PMOS transistor and an NMOS transistor. In the first transfer gate circuit 88*a*, the gate of the PMOS transistor is provided with the second output internal clock signal CLKOUT2 via inverters 89*a*, 89*b*, and the gate of the NMOS transistor is provided with the second output internal clock signal CLKOUT2 via the inverter 89*a*. In the second transfer gate circuit 88*b*, the gate of the PMOS transistor is provided with the second output internal clock signal CLKOUT2 via the inverter 89*a*, and the gate of the NMOS transistor is provided with the second output internal clock signal CLKOUT2 via the inverters 89*a*, 89*b*. Accordingly, the first and second transfer gate circuits 88*a*, 88*b* are activated and deactivated alternately by the second output internal clock signals CLKOUT2.

The input terminal of the first transfer gate circuit 88*a* is connected to the output terminals of the eleventh, twelfth, and thirteenth transfer gate circuits 86*a*, 86*b*, 86*c* and provides one of the first to third late signals LAT1, LAT2Z, LAT3Z to a NAND circuit 90.

The NAND circuit 90 has a first input terminal connected to the output terminal of the first transfer gate circuit 88*a*, a second input terminal which receives a control signal SGX from the burst waveform altering circuit 115*c*, and an output terminal connected to the input terminal of a CMOS transistor T14. The output terminal of the CMOS transistor T14 is connected to the output terminal of the first transfer gate circuit 88*a* and the first input terminal of the NAND circuit 90.

The CMOS transistor T14 includes a PMOS transistor T15 and an NMOS transistor T16, which are connected in series to each other. The PMOS transistor T15 is activated and deactivated in response to the second output internal clock signal CLKOUT2 provided via the inverter 89*a*. The NMOS transistor T16 is activated and deactivated in response to the second output internal clock signal CLK-OUT2 provided via the inverters 89*a*, 89*b*. Thus, when the first transfer gate circuit 88*a* is deactivated, the CMOS transistor T14 is activated, and when the first transfer gate circuit 88a is activated, the CMOS transistor gate circuit T14 is deactivated.

The NAND circuit 90 and the CMOS transistor T14 form a latch circuit. When the NAND circuit 90 is provided with a high control signal SGX from the burst waveform altering circuit 115c and a low late signal from the first transfer gate circuit 88a, the NAND circuit 90 outputs a high signal. When the CMOS transistor T14 is activated (i.e., when the first transfer gate circuit 88a is deactivated) and a low late signal is provided to the NAND circuit 90 from the CMOS transistor T14, the NAND circuit 90 outputs a high signal. When the first transfer gate circuit 88a is activated and a high late signal is provided to the NAND circuit 90, the NAND circuit 90 outputs a low signal. If a low late signal is provided to the NAND circuit 90 in this state, the NAND circuit 90 outputs a high signal.

The output signal of the NAND circuit 90 is provided to an inverter 91 via the second transfer gate circuit 88b. A NAND circuit 92 has a first input terminal connected to the output terminal of the inverter 91, a second input terminal for receiving the control signal SGX from the burst waveform altering circuit 115c, and an output terminal connected to the input terminal of the inverter 91 and the output terminal of the second transfer gate circuit 88b.

The inverter 91 and the NAND circuit 92 form a latch circuit. If the NAND circuit 90 provides the inverter 91 with a low signal via the second transfer gate circuit 88b when the burst waveform altering circuit 115c outputs a high control signal SGX and the inverter 91 outputs a low signal, the inverter 91 outputs a high signal. If a high signal is provided to the NAND circuit 90 via the second transfer gate circuit 88b when the inverter 91 outputs a high signal, the inverter 91 outputs a low signal. The output signal SG25 of the inverter 91 is output through inverters 93a, 93b as the output control signal OE0Z. The output control signal generating circuit 115b acquires the selected late signal in response to the second output internal clock signal CLKOUT2 and outputs the late signal as the output control signal OE0Z in response to the subsequent rising of the second internal clock signal CLKOUT2.

Burst Waveform Altering Circuit 115c

The burst waveform altering circuit 115c includes a NAND circuit 94 and inverters 95a, 95b. The NAND circuit 94 has three input terminals to receive the output signal SG25 of the inverter 91, the first output internal clock signal CLKOUT1, and a fourth burst length mode signal BL4Z.

The fourth burst length mode signal BL4Z is a burst length selection signal set in accordance with an output signal from the DRAM controller. In the first embodiment, when the burst length is 1, the fourth burst length mode signal BL4Z is set at a high level. At other burst lengths, the fourth burst length mode signal BL4Z is set at a low level. When the burst length is not 1, the NAND circuit 94 outputs a high signal and the NAND circuits 90, 92 are provided with a high control signal SGX via the inverters 95a, 95b.

When the fourth burst length mode signal BL4Z, the output signal SG25 of the inverter 91, and the first output internal clock signal CLKOUT1 are all high, the NAND circuit 94 outputs a low signal and the NAND circuits 90, 92 are provided with a low control signal SGX via the inverters 95a, 95b. As a result, the inverter 91 outputs a low output signal SG25, or output control signal OE0Z. More specifically, when the burst length is 1, the selected late signal is acquired in response to the falling of the second output internal clock signal CLKOUT2, and a high output control signal OE0Z is output in response to the subsequent rising of the second output internal clock signal CLKOUT2. The burst waveform altering circuit 115c then outputs a high control signal SGX in response to the first output internal clock signal CLKOUT1. The high output control signal OE0Z falls to a low level after a half cycle of the second output internal clock signal CLKOUT2 elapses.

For example, as shown in FIG. 10, if the third late signal LAT3Z is selected by the first mode signal MDL1Z, the third late signal LAT3Z is output in accordance with the second output internal clock signal CLKOUT2 as the output control signal OE0Z. More specifically, the phase of the third late signal LAT3Z is delayed from the phase of the shaping signal POE0Z by two and a half cycles of the first output internal clock signal CLKOUT1. The shaping signal POE0Z generated by the first BL shaping circuit 113 is acquired by the first latency counter 114 when the first output internal clock signal CLKOUT1 falls. When the second pulse of the first output internal clock signal CLKOUT1 rises, the first latency counter 114 provides the first to third late signals to the first output CLK control circuit 115. The selected third late signal LAT3Z is acquired by the first output CLK control circuit 115 when the second output internal clock signal CLKOUT2 falls in synchronism with the rising of the second pulse of the first output internal clock signal CLKOUT1. The third late signal LAT3Z is output as the output control signal OE0Z when the pulse following the second output internal clock signal CLKOUT2 rises. In other words, when the third late signal LAT3Z is selected, the shaping signal POE0Z is output as the output control signal OE0Z from the first output CLK control circuit 115 delayed by three cycles of the first output internal clock signal CLKOUT1 and in synchronism with the rising of the second output internal clock signal CLKOUT2.

When the second late signal LAT2Z is selected by the second mode signal MDL2Z, the second late signal LAT2Z is output in accordance with the second output internal clock signal CLKOUT2 as the output control signal OE0Z. That is, the second late signal LAT2Z is delayed from the shaping signal POE0Z by a cycle and a half of the first output internal clock signal CLKOUT1. In other words, the shaping signal POE0Z generated by the first BL shaping circuit 113 is output as the output control signal OE0Z from the first output CLK control circuit 115 delayed by two cycles of the first output internal clock signal CLKOUT1 and in synchronism with the rising of the second output internal clock signal CLKOUT2.

Further, if the first late signal LAT3Z is selected by the third mode signal MDL3Z, the first late signal LAT1Z is output in accordance with the second output internal clock signal CLKOUT2 as the output control signal OE0Z. That is, the first late signal LAT1Z is delayed from the shaping signal POE0Z by half a cycle of the first output internal clock signal CLKOUT1. In other words, the shaping signal POE0Z generated by the first BL shaping circuit 113 is output as the output control signal OE0Z from the first output CLK control circuit 115 delayed by one cycle of the first output internal clock signal CLKOUT1 and in synchronism with the rising of the second output internal clock signal CLKOUT2.

The first output control circuit 110, which includes the first counter reset circuit 111, the first BL counter 112, the first BL shaping circuit 113, the first latency counter 114, and the first output CLK control circuit 115, outputs a high output control signal OE0Z at a timing corresponding to each mode when provided with a high 0° read command RED0Z. This stops the operation of the second output control circuit 120 and causes the second output CLK control circuit 125 to output a low output control signal OE18Z.

When the second output control circuit 120 is provided with the 180° read command RED180Z, the second output control circuit 120 outputs a high output control signal OE18Z in response to the rising of the first output internal clock signal CLKOUT1 at a timing corresponding to each mode. This stops the operation of the first output control circuit 110 and causes a low output control signal OE0Z to be output.

Output CLK Generating Circuit 130

Figure 7:
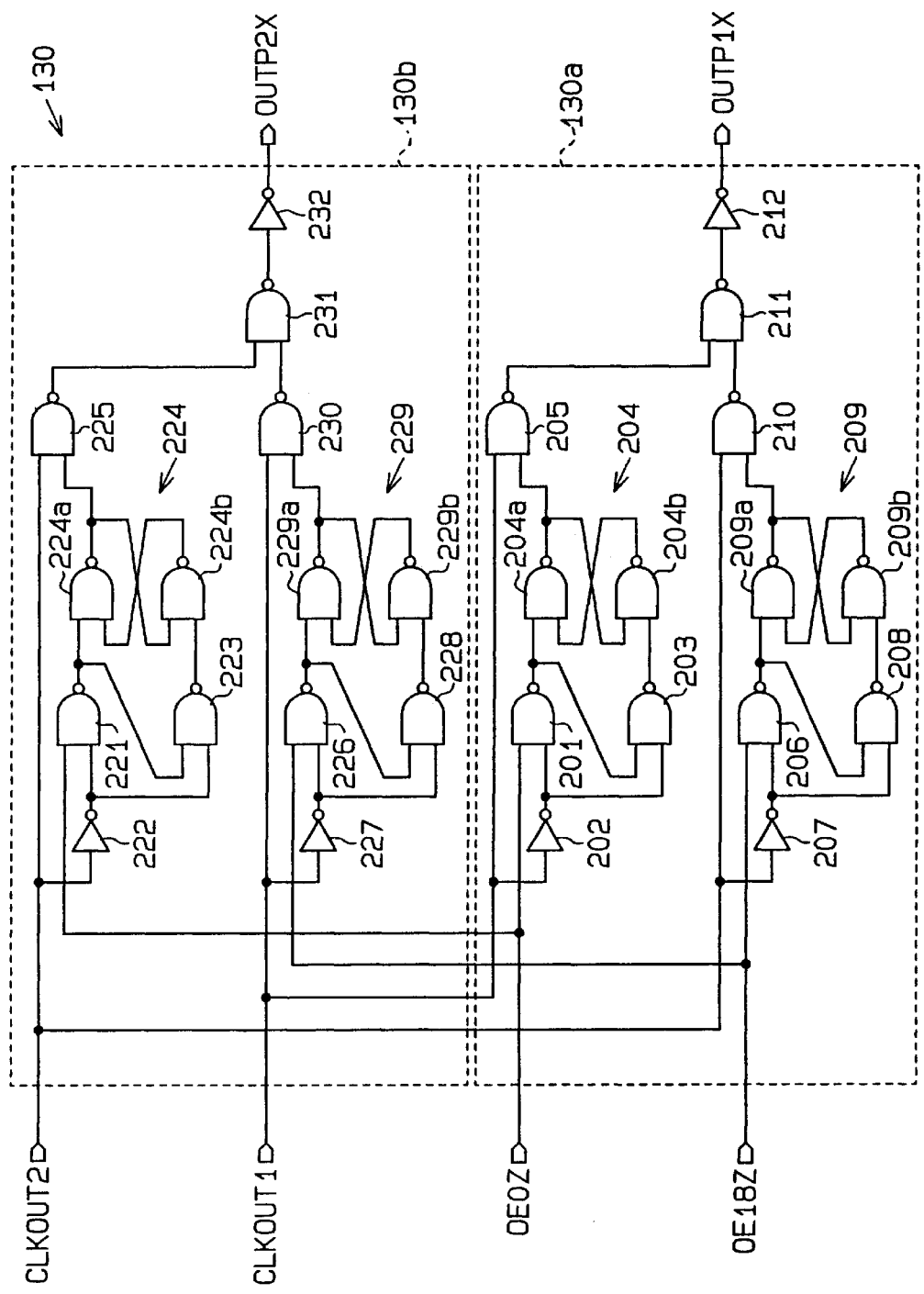
FIG. 7 is a circuit diagram showing an output CLK generating circuit of the data signal output circuit of FIG. 1.

FIG. 7 is a circuit diagram showing the output CLK generating circuit 130. The output CLK generating circuit 130 generates a first output clock signal OUTP1X equal to an inverted first output internal clock signal CLKOUT1 when the output control signal OE0Z from the first output CLK control circuit 115 rises. The output CLK generating circuit 130 then generates a second output clock signal OUTP2X which is equal to an inverted second output internal clock signal CLKOUT2 when the second output internal clock signal CLKUT2 falls after the output control signal OE0Z rises.

The first output clock signal OUTP1X is output half a cycle after the first output internal clock signal CLKOUT1. Thus, the first output clock signal OUTP1X falls when one cycle of the external clock signal CLK elapses after the output control signal OE0Z rises.

The output CLK generating circuit 130 generates the first output clock signal OUTP1X equal to an inverted second output internal clock signal CLKOUT2 when the output control signal OE18Z from the second output CLK control circuit 125 rises. The output CLK generating circuit 130 then generates the second output clock signal OUTP2X equal to an inverted first output internal clock signal CLK-OUT1 when the first output internal clock signal CLKOUT1 falls after the output control signal OE18Z rises.

If either the output control signal OE0Z or the output control signal OE18Z falls, the first output clock signal OUTP1X is always output first with the second output clock signal OUTP2X being output half a cycle of the first output clock signal OUTP1X later. The output CLK generating circuit 130 includes a first output clock signal generating circuit 130a and a second clock signal generating circuit 130b.

First Output Clock Signal Generating Circuit 130a

The first output clock signal generating circuit 130a includes a first NAND circuit 201. The first NAND circuit 201 receives the output control signal OE0Z from the first output CLK control circuit 115 and the first output internal clock signal CLKOUT1 provided via an inverter 202 and outputs a high signal regardless of the first output internal clock signal CLKOUT1 when the output control signal OE0Z is low. Further, the first NAND circuit 201 outputs a signal which level is substantially the same as the first output internal clock signal CLKOUT1 when the output control signal OE0Z is high.

A second NAND circuit 203 receives the output signal of the first NAND circuit 201 and the first output internal clock signal CLKOUT1 provided via the inverter 202 and outputs a signal which level is substantially the same as the first output internal clock signal CLKOUT1 when the output control signal OE0Z is low (i.e., when the output signal from the first NAND circuit 201 is high). Further, the second NAND circuit 203 always outputs a high signal when the first NAND circuit 201 provides an output signal which level is substantially the same as the first output internal clock signal CLKOUT1.

An eleventh FF circuit 204 including two NAND circuits 204a, 204b has a reset input terminal (the input terminal of the NAND circuit 204a) which receives the output signal of the first NAND circuit 201, a set input terminal (the input terminal of the NAND circuit 204b) which receives the output signal of the second NAND circuit 203, and a reset output terminal (the output terminal of the NAND circuit 204a). The eleventh FF circuit 204 outputs a low signal from the reset output terminal when the output control signal OE0Z is low. When the second output internal clock signal CLKOUT2 and the output control signal OE0Z both rise, the output signal of the first NAND circuit 201 falls. As a result, the eleventh FF circuit 204 is inverted and a high signal is output from the reset output terminal. If the output control signal OE0Z and the first output internal clock signal CLKOUT1 fall, the output signal from the reset output terminal is inverted to a low level.

A third NAND circuit 205 receives the output signal from the reset output terminal of the eleventh FF circuit 204 and the first output internal clock signal CLKOUT1 and outputs a high signal when the output signal of the eleventh FF circuit 204 is low (i.e., when the output control signal OE0Z is low) regardless of the first output internal clock signal CLKOUT1. When the output signal from the eleventh FF circuit 204 is high, the third NAND circuit 205 outputs an inverted signal of the first output internal clock signal CLKOUT1.

A fourth NAND circuit 206 receives the output control signal OE18Z from the second output CLK control circuit 125 and the second output internal clock signal CLKOUT2 provided via an inverter 207 and outputs a high signal when the output control signal OE18Z is low regardless of the second output internal clock signal CLKOUT2. When the output control signal OE18Z is high, the fourth NAND circuit 206 outputs a signal having the same phase as the second output internal clock signal CLKOUT2.

A fifth NAND circuit 208 receives the output signal from the fourth NAND circuit 206 and the second output internal clock signal CLKOUT2 provided via the inverter 207 and outputs a signal having the same phase as the second output internal clock signal CLKOUT2 when the output control signal OE18Z is low (i.e., when the output signal of the fourth NAND circuit 206 is high). When the fifth NAND circuit 208 receives a signal having the same phase as the second output internal clock signal CLKOUT2 from the fourth NAND circuit 206, the fifth NAND circuit 208 outputs a high signal.

A twelfth FF circuit 209 includes two NAND circuits 209a, 209b and has a reset input terminal (the input terminal of the NAND circuit 209a) which receives the output signal of the fourth NAND circuit 206, a set input terminal (the input terminal of the NAND circuit 209b) which receives the output signal of the fifth NAND circuit 208, and a reset output terminal (the output terminal of the NAND circuit 209a). Thus, the twelfth FF circuit 209 outputs a low signal from the reset output terminal when the output control signal OE18Z is low. When the first output internal clock signal CLKOUT1 and the output control signal OE18Z both rise, the output signal of the fourth NAND circuit 206 falls. As a result, the output signal of the twelfth FF circuit 209 is inverted and a high signal is output from the reset output terminal. If the output control signal OE18Z and the second output internal clock signal CLKOUT2 fall, the high signal output by the reset output terminal is inverted to a low level.

A sixth NAND circuit 210 receives the output signal from the reset output terminal of the twelfth FF circuit 209 and the second output internal clock signal CLKOUT2 and outputs a high signal when the output signal of the twelfth FF circuit 209 is low (i.e., when the output control signal OE18Z is low) regardless of the second output internal clock signal CLKOUT2. When the output signal from the twelfth FF circuit 209 is high, the sixth NAND circuit 210 outputs an inverted signal of the second output internal clock signal CLKOUT2.

A seventh NAND circuit 211 receives the output control signals of the third and sixth NAND circuits 205, 210. When the signal output from the sixth NAND circuit 210 is high (i.e., when the operation of the second output control circuit 120 is stopped causing the output control signal OE18Z to be low), the seventh NAND circuit 211 provides the inverted signal of the first output internal clock signal CLKOUT1 from the third NAND circuit 205 to an inverter 212 in response to the rising of the output control signal OE0Z.

When a high signal is output from the third NAND circuit 205 (i.e., when the deactivation of the first output control circuit 110 causes the output control signal OE0Z to be low), the seventh NAND circuit 211 provides the inverted signal of the second output internal clock signal CLKOUT2, which is sent from the sixth NAND circuit 210, to the inverter 212 in response to the rising of the output control signal OE18Z. The inverter 212 outputs the inverted output signal of the seventh NAND circuit 211 as the first output clock signal OUTP1X.

When the deactivation of the second output control circuit 120 causes the output control signal OE18Z to be low, the first output clock signal generating circuit 130a outputs the inverted first internal clock signal CLKOUT1 as the first output clock signal OUTP1X in response to the rising of the output control signal OE0Z (i.e., the rising of the second output internal clock signal CLKOUT2).

Further, when the deactivation of the first output control circuit 110 causes the output control signal OE0Z to be low, the first output clock signal generating circuit 130a outputs the inverted second internal clock signal CLKOUT2 as the first output clock signal OUTP1X in response to the rising of the output control signal OE18Z (i.e., the rising of the first output internal clock signal CLKOUT1).

Second Output Clock Signal Generating Circuit 130b

The second output clock signal generating circuit 130b includes an eighth NAND circuit 221. The eighth NAND circuit 221 receives the output control signal OE0Z from the first output CLK control circuit 115 and the second output internal clock signal CLKOUT2 provided via an inverter 222 and outputs a high signal regardless of the second output internal clock signal CLKOUT2 when the output control signal OE0Z is low. Further, the eighth NAND circuit 221 outputs a signal which is substantially the same as the second output internal clock signal CLKOUT2 when the output control signal OE0Z is high.

A ninth NAND circuit 223 receives the output signal of the eighth NAND circuit 221 and the second output internal clock signal CLKOUT2 provided via the inverter 222 and outputs a signal which is substantially the same as the second output internal clock signal CLKOUT2 when the output control signal OE0Z is low (i.e., when the output signal from the eighth NAND circuit 221 is high). Further, the ninth NAND circuit 223 always outputs a high signal when the eighth NAND circuit 221 provides a signal which level is substantially the same as the second output internal clock signal CLKOUT2.

A thirteenth FF circuit 224 including two NAND circuits 224a, 224b has a reset input terminal (the input terminal of the NAND circuit 224a) which receives the output signal of the eighth NAND circuit 221, a set input terminal (the input terminal of the NAND circuit 224b) which receives the output signal of the ninth NAND circuit 223, and a reset output terminal (the output terminal of the NAND circuit 224a). The thirteenth FF circuit 224 outputs a low signal from the reset output terminal when the output control signal OE0Z is low. When the output control signal OE0Z rises and the second output internal clock signal CLKOUT2 falls, the output signal of the eighth NAND circuit 221 falls. As a result, the thirteenth FF circuit 224 is inverted and a high signal is output from the reset output terminal. If the output control signal OE0Z falls and the second output internal clock signal CLKOUT2 rises, the output signal from the reset output terminal is inverted to a low level.

A tenth NAND circuit 225 receives the output signal from the reset output terminal of the thirteenth FF circuit 224 and the second output internal clock signal CLKOUT2 and outputs a high signal when the output signal of the thirteenth FF circuit 224 is low (i.e., when the output control signal OE0Z is low) regardless of the second output internal clock signal CLKOUT2. When the output signal from the thirteenth FF circuit 224 is high, the tenth NAND circuit 225 outputs an inverted signal of the second output internal clock signal CLKOUT2.

An eleventh NAND circuit 226 receives the output control signal OE18Z from the second output CLK control circuit 125 and the first output internal clock signal CLKOUT1 provided via an inverter 227 and outputs a high signal when the output control signal OE18Z is low regardless of the first output internal clock signal CLKOUT1. When the output control signal OE18Z is high, the eleventh NAND circuit 226 outputs a signal having substantially the same phase as the first output internal clock signal CLKOUT1.

A twelfth NAND circuit 228 receives the output signal from the eleventh NAND circuit 226 and the first output internal clock signal CLKOUT1 provided via the inverter 227 and outputs a signal having the same phase as the first output internal clock signal CLKOUT1 when the output control signal OE18Z is low. When the twelfth NAND circuit 228 receives a signal having the same phase as the first output internal clock signal CLKOUT1 from the eleventh NAND circuit 226, the twelfth NAND circuit 228 outputs a high signal.

A fourteenth FF circuit 229 includes two NAND circuits 229a, 229b and has a reset input terminal (the input terminal of the NAND circuit 229a) which receives the output signal of the eleventh NAND circuit 226, a set input terminal (the input terminal of the NAND circuit 229b) which receives the output signal of the twelfth NAND circuit 228, and a reset output terminal (the output terminal of the NAND circuit 229a).

The fourteenth FF circuit 229 outputs a low signal from the reset output terminal when the output control signal OE18Z is low. When the output control signal OE18Z rises and the first output internal clock signal CLKOUT1 falls, the output signal of the eleventh NAND circuit 226 falls. As a result, the output signal of the fourteenth FF circuit 229 is inverted and a high signal is output from the reset output terminal. If the output control signal OE18Z and the first output internal clock signal CLKOUT1 fall, the output signal of the reset output terminal is inverted to a low level.

A thirteenth NAND circuit 230 receives the output signal from the reset output terminal of the fourteenth FF circuit 229 and the first output internal clock signal CLKOUT1 and outputs a high signal when the output signal of the fourteenth FF circuit 229 is low (i.e., when the output control signal OE18Z is low) regardless of the first output internal clock signal CLKOUT1. When the output signal from the fourteenth FF circuit 229 is high, the thirteenth NAND circuit 230 outputs an inverted signal of the first output internal clock signal CLKOUT1.

A fourteenth NAND circuit 231 receives the output control signals of the tenth and thirteenth NAND circuits 225, 230. If the signal output from the thirteenth NAND circuit 230 goes high when the output control signal OE0Z rises and the second output internal clock signal CLKOUT2 falls, the fourteenth NAND circuit 231 provides a signal having substantially the same level as the second output internal clock signal CLKOUT2 to an inverter 232.

If the output signal of the tenth NAND circuit 225 goes high when the output control signal OE18Z goes high and the first output internal clock signal CLKOUT1 falls, the tenth NAND circuit 225 provides a signal having substantially the same level as the first output internal clock signal CLKOUT1 to the inverter 232. The inverter 232 outputs the inverted output signal of the fourteenth NAND circuit 231 as the second output clock signal OUTP2X.

When the deactivation of the second output control circuit 120 causes the output control signal OE18Z to be low, the second output clock signal generating circuit 130b outputs the inverted second internal clock signal CLKOUT2 as the second output clock signal OUTP2X in response to the rising of the output control signal OE0Z and the falling of the second output internal clock signal CLKOUT2.

Further, when the deactivation of the first output control circuit 110 causes the output control signal OE0Z to be low, the second output clock signal generating circuit 130b outputs the inverted first internal clock signal CLKOUT1 as the second output clock signal OUTP2X in response to the rising of the output control signal OE18Z and the falling of the first output internal clock signal CLKOUT1.

Hiz Generating Circuit

Figure 8:
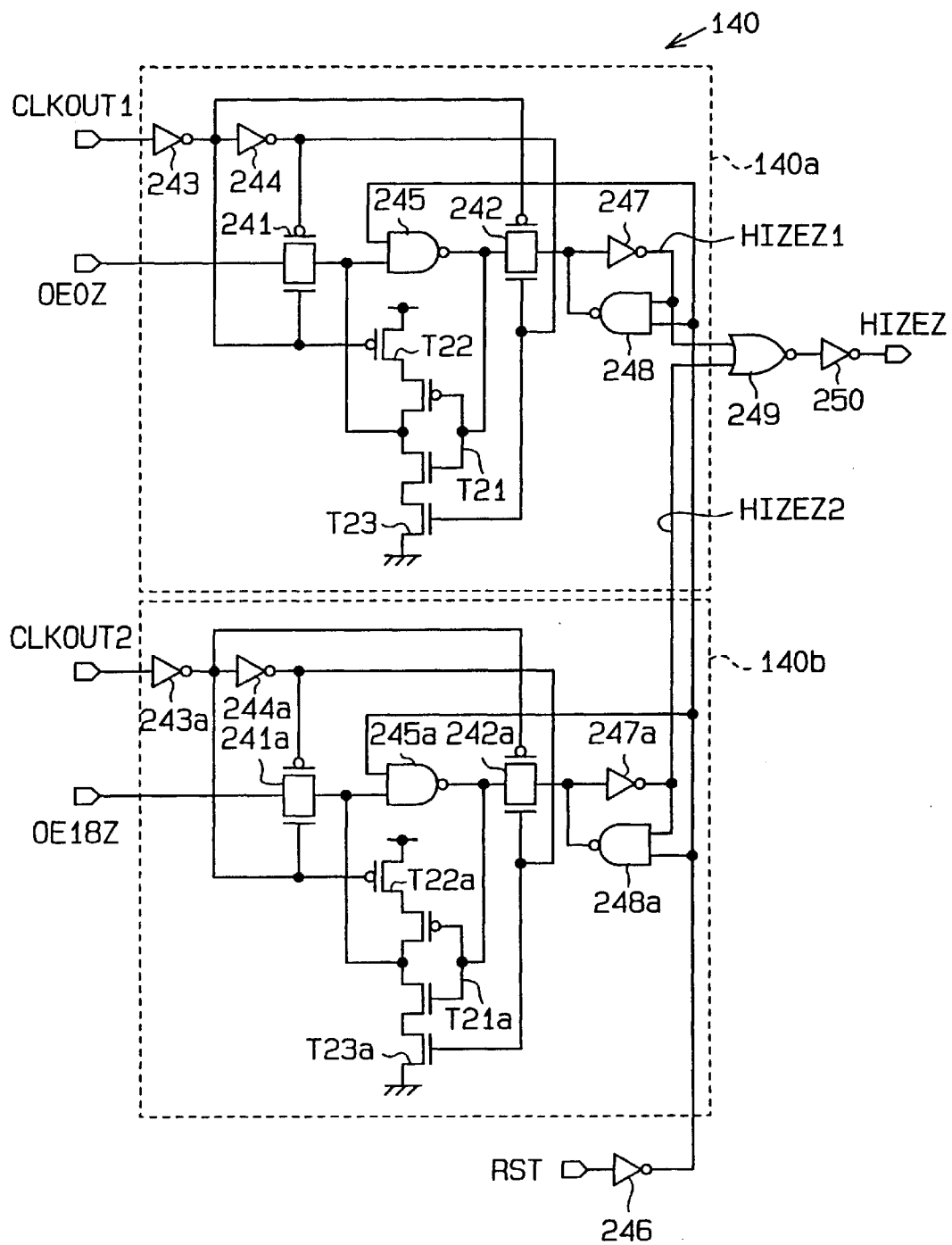
FIG. 8 is a circuit diagram showing a Hiz generating circuit of the data signal output circuit of FIG. 1.

FIG. 8 is a circuit diagram showing an Hiz generating circuit 140. The Hiz generating circuit 140 includes a first Hiz signal generating portion 140a for receiving the output control signal OE0Z from the first output control circuit 110 and generating a first Hiz signal HIZEZ1, and a second Hiz signal generating portion 140b for receiving the output control signal OE18Z from the second output control circuit 120 and generating a second Hiz signal HIZEZ2.

When the first Hiz signal generating portion 140a receives a high output control signal OE0Z, the first Hiz signal generating portion 140a outputs a high first Hiz signal HIZEZ1 in response to the falling of the first output internal clock signal CLKOUT1 with a delay of half a cycle from the first output internal clock signal CLKOUT1. When the first Hiz signal generating portion 140a receives a low output control signal OE0Z, the first Hiz signal generating portion 140a outputs a low first Hiz signal HIZEZ1 delayed by half a cycle from the first output internal clock signal CLKOUT1.

When the second Hiz signal generating portion 140b receives a high output control signal OE18Z, the second Hiz signal generating portion 140b outputs a high second Hiz signal HIZEZ2 in response to the falling of the second output internal clock signal CLKOUT2 with a delay of half a cycle from the second output internal clock signal CLKOUT2. When the second Hiz signal generating portion 140b receives a low output control signal OE18Z, the second Hiz signal generating portion 140b outputs a low second Hiz signal HIZEZ2 delayed by half a cycle from the second output internal clock signal CLKOUT2.

Since the circuit structure of the first Hiz signal generating portion 140a and the second Hiz signal generating portion 140b are the same, only the first signal generating portion 140a will be described. In the second Hiz signal generating portion 140b, devices that are the same or similar to corresponding devices in the first Hiz signal generating portion 140a are denoted with the same reference numeral followed by the letter "a".

First Hiz Signal Generating Portion 140a

The first Hiz signal generating portion 140a includes first and second transfer gate circuits 241, 242, each of which has a PMOS transistor and an NMOS transistor.

In the first transfer gate circuit 241, the gate of the PMOS transistor is provided with the first output internal clock signal CLKOUT1 via inverters 243, 244 and the gate of the NMOS transistor is provided with first output internal clock signal CLKOUT1 via the inverter 243. In the second transfer gate circuit 242, the gate of the PMOS transistor is provided with the first output internal clock signal CLKOUT1 via the inverter 243 and the gate of the NMOS transistor is provided with the first output internal clock signal CLKOUT1 via the inverters 243, 244. Accordingly, the first and second transfer gate circuits 241, 242 are activated and deactivated alternately by the first output internal clock signal CLKOUT1.

A NAND circuit 245 has a first input terminal for receiving the output control signal OE0Z via the first transfer gate circuit 241, a second input terminal for receiving the reset signal RST via the inverter 246, and an output terminal connected to the input terminal of a CMOS transistor T21. The output terminal of the CMOS transistor T21 is connected to the output terminal of the first transfer gate circuit 241 and the first input terminal of the NAND circuit 245.

The CMOS transistor T21 is connected to a PMOS transistor T22 and an NMOS transistor T23, which are connected in series to each other. The PMOS transistor T22 is activated and deactivated in response to the first output internal clock signal CLKOUT1 provided via the inverter 243. The NMOS transistor T23 is activated and deactivated in response to the first output internal clock signal CLKOUT1 provided via the inverters 243, 244. Accordingly, deactivation of the first transfer gate 241 activates the CMOS transistor T21 and activation of the first transfer gate 241 deactivates the CMOS transistor T21.

The NAND circuit 245 and the CMOS transistor T21 form a latch circuit. When the NAND circuit 245 receives a low output control signal OE0Z, the NAND circuit 245 outputs a high signal, activates the CMOS transistor T21 (in this state, the first transfer gate circuit 241 is deactivated), and causes the CMOS transistor T21 to provide a low signal to the NAND circuit 245. Thus, the NAND circuit 245 holds the output of the high signal. Afterward, if the NAND circuit 245 receives a high output control signal OE0Z, the NAND circuit 245 outputs a low signal. When the NAND circuit 245 is provided with a low output control signal OE0Z in this state, the output signal of the NAND circuit 245 is inverted and goes high.

The output signal of the NAND circuit 245 is provided to an inverter 247 via the second transfer gate circuit 242. The NAND circuit 248 has a first input terminal connected to the output terminal of the inverter 247, a second input terminal for receiving the reset signal RST via the inverter 246, and an output terminal connected to the input terminal of the inverter 247.

The inverter 247 and the NAND circuit 248 form a latch circuit. If the inverter 246 outputs a high signal and the inverter 247 outputs a low signal, the NAND circuit 248 outputs a high signal. If a high signal is provided by the NAND circuit 245 in this state, the inverter 247 outputs a low signal. The output signal of the inverter 247 is output as the Hiz signal HIZEZ via a NOR circuit 249 and an inverter 250.

Therefore, in the first signal generating portion 140a, the output signal of the NAND circuit 245 falls when the NAND circuit 245 is provided with a high output control signal OE0Z via the first transfer gate circuit 241, which has been activated by a high first output internal clock signal CLK-OUT1. Afterward, the Hiz signal HIZEZ rises when the NAND circuit 245 provides the inverter 247 with a low signal via the second transfer gate circuit 242, which has been activated by a low first output internal clock signal CLKOUT1.

Output Buffer 150

Figure 9:
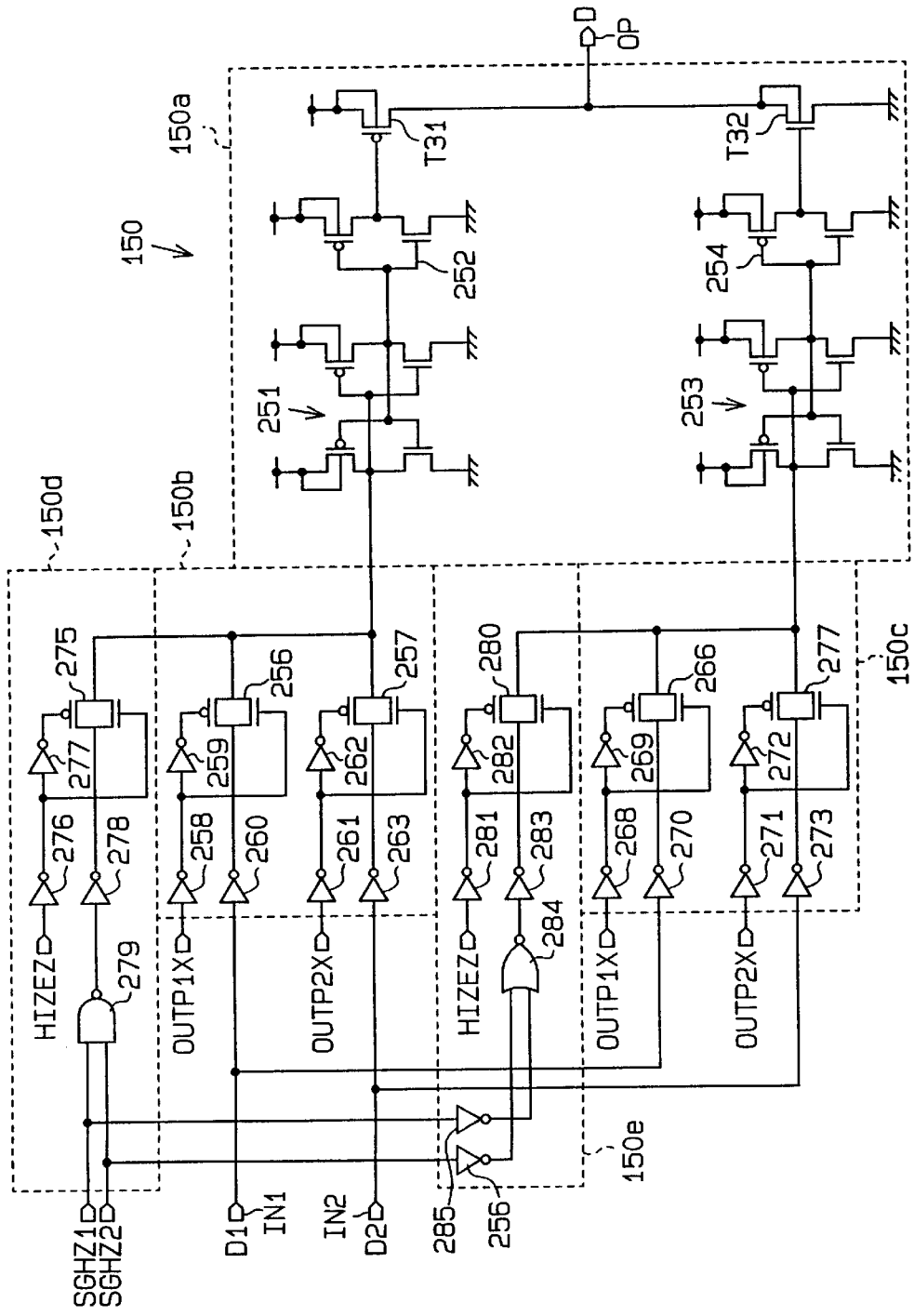
FIG. 9 is a circuit diagram showing an output buffer circuit of the data signal output circuit of FIG. 1.

FIG. 9 is a circuit diagram showing the output buffer 150. The output buffer 150 acquires a first data signal D1 in response to the falling of the first output clock signal OUTP1X and outputs the first data signal D1. The output buffer 150 then acquires a second data signal D2 in response to the falling of the second output clock signal OUTP2X and outputs the second data signal D2. The first data signal D1 and the second data signal D2 are output alternately from the output buffer 150 until the total of the number of failings of the first output clock signal OUTP1X and the number of failings of the second output clock signal OUTP2X becomes equal to a predetermined number of the burst length. When the second output clock signal OUTP2X rises after falling for the final time, the Hiz signal HIZEZ falls half a cycle after the second output clock signal OUT2PX.

The output buffer 150 acquires first and second mode control signals SGHZ1, SGHZ2 in response to the falling of the Hiz signal HIZEZ and sets the output terminal in a high impedance state.

Further, the output buffer 150 includes a buffer circuit 150a, a first data input portion 150b, a second data input portion 150c, a first high impedance control portion 150d, and a second high impedance control portion 150e.

Buffer Circuit 150a

The buffer circuit 150a includes an output PMOS transistor (hereafter referred to as first output transistor) T31 and an output NMOS transistor (hereafter referred to as second output transistor) T32.

The source of the first output transistor T31 is connected to a high potential power supply and the drain of the output transistor T31 is connected to the drain of the second output transistor T32. The source of the second output transistor T32 is grounded. The node between the first and second output transistors T31, T32 is connected to an output pad OP, which serves as an output terminal.

The gate of the first output transistor T31 receives an upper arm data signal from the first data input portion 150b via a latch circuit 251 and an inverter 252. The gate of the second output transistor T32 receives a lower arm data signal from the second data input portion 150c via a latch circuit 253 and an inverter 254. Thus, when the upper arm and lower arm signals are both low, the first output transistor T31 is activated and the second output transistor T32 is deactivated. This outputs a high data signal D from the output pad OP. When the upper arm and lower arm signals are both high, the first output transistor T31 is deactivated and the second output transistor T32 is activated. This outputs a low data signal D from the output pad OP. Further, when the upper arm data signal is high and the lower arm data signal is low, the first and second output transistors T31, T32 are both deactivated. This sets the output pad OP in a high impedance state.

First Data Input Portion 150b

The first data input portion 150b includes a first upper transfer gate circuit 256 and a second upper transfer gate circuit 257.

In the first upper transfer gate circuit 256, the gate of the PMOS transistor is provided with the first output clock signal OUTP1X via inverters 258, 259 and the gate of the NMOS transistor is provided with the first output clock signal OUTP1X via the inverter 258. The input terminal of the first upper transfer gate circuit 256 is connected to a first data input terminal IN1 of the output buffer 150 via an inverter 260. The first upper transfer gate circuit 256 receives the first data signal D1 via the inverter 260 and provides the inverted first data signal D1 as the upper arm data signal to the latch circuit 251.

In the second upper transfer gate circuit 257, the gate of the PMOS transistor is provided with the second output clock signal OUTP2X via inverters 261, 262 and the gate of the NMOS transistor is provided with the second output clock signal OUTP2X via the inverter 261. The input terminal of the second upper transfer gate circuit 257 is connected to a second data input terminal IN2 of the output buffer 150 via an inverter 263. The second upper transfer gate circuit 257 receives the second data signal D2 via the inverter 263 and provides the inverted second data signal D2 as the upper arm data signal to the latch circuit 251.

Second Data Input Portion

The second data input portion 150c includes a first lower transfer gate circuit 266 and a second lower transfer gate circuit 267.

In the first lower transfer gate circuit 266, the gate of the PMOS transistor is provided with the first output clock signal OUTP1X via inverters 268, 269 and the gate of the NMOS transistor is provided with the first output clock signal OUTP1X via the inverter 268. The input terminal of the first lower transfer gate circuit 266 receives the first data signal D1 via an inverter 270 and provides the inverted first data signal D1 as the lower arm data signal to the latch circuit 253.

In the second lower transfer gate circuit 267, the gate of the PMOS transistor is provided with the second output clock signal OUTP2X via inverters 271, 272 and the gate of the NMOS transistor is provided with the second output clock signal OUTP2X via the inverter 271. The input terminal of the second lower transfer gate circuit 267 receives the second data signal D2 via an inverter 273 and provides the inverted second data signal D2 as the lower arm data signal to the latch circuit 253.

First High Impedance Control Portion 150d

The first high impedance control portion 150d includes a first control transfer gate circuit 275. In the first control transfer gate circuit 275, the gate of the PMOS transistor is provided with the Hiz signal HIZEZ via inverters 276, 277 and the gate of the NMOS transistor is provided with the Hiz signal HIZEZ via the inverter 277.

The input terminal of the first transfer gate circuit 275 is connected to the output terminal of a NAND circuit 279 via an inverter 278. The NAND circuit 279 functions as a test data input circuit and has a first mode input terminal to receive a first mode control signal SGHZ1 and a second mode input terminal to receive a second mode control signal SGHZ2. The first and second mode control signals SGHZ1, SGHZ2 are set in accordance with the command from the DRAM controller.

The first and second mode control signals SGHZ1, SGHZ2 are both set at a low level under normal modes, such as when performing a read operation. In a normal mode, the NAND circuit 279 outputs a low signal. Thus, the first high impedance control portion 150d provides a high signal as the upper arm data signal to the latch circuit 251 as long as the transfer gate circuit 276 is activated by a low Hiz signal HIZEZ. This deactivates the transistor T31.

In a test mode, the first mode control signal SGHZ1 is set at a low level, and the NAND circuit 279 outputs the second mode control signal SGHZ2 as a test signal. Further, in the test mode, the NAND circuit 279 outputs the inverted second mode control signal SGHZ2. Thus, the first high impedance control portion 150d provides the upper arm data signal to the latch circuit 251 as long as the transfer gate circuit 276 is activated. This activates and deactivates the first output transistor T31 in synchronism with the second mode control signal SGHZ2.

Second High Impedance Control Portion 150e

The second high impedance control portion 150e includes a second control transfer gate circuit 280. In the second control transfer gate circuit 280, the gate of the PMOS transistor is provided with the Hiz signal HIZEZ via inverters 281, 282 and the gate of the NMOS transistor is provided with the Hiz signal HIZEZ via the inverter 281.

The input terminal of the second transfer gate circuit 280 is connected to the output terminal of a NOR circuit 284 via an inverter 283. The NOR circuit 284 functions as a test data input circuit and has a first input terminal to receive the first mode control signal SGHZ1 and a second input terminal to receive the second mode control signal SGHZ2 via an inverter 285.

In a normal mode, the NOR circuit 284 outputs a high signal. Thus, the second high impedance control portion 150e provides a high signal as the upper arm data signal to the latch circuit 253 as long as the transfer gate circuit 280 is activated. This deactivates the second output transistor T32.

In a test mode, the NOR circuit 284 outputs the inverted second mode control signal SGHZ2. Thus, the second high impedance control portion 150e provides the lower arm data signal to the latch circuit 251 as long as the transfer gate circuit 280 is activated. This activates and deactivates the second output transistor T32 in synchronism with the second mode control signal SGHZ2.

In the output buffer 150, the first mode control signal SGH1 is set at a low level when the transfer gate circuit 280 is activated by a low Hiz signal HIZEZ, and the second mode control signal SGHZ2 is provided as a test data signal to the first and second high impedance control portions 150d, 150e. The test data signals activate and deactivate the output transistors T31, T32 and tests the output buffer 150.

The characteristics of the synchronous DRAM data output circuit 100 will now be described. To facilitate understanding, the characteristics will be described in accordance with the first output control circuit 110.

(1) With reference to FIG. 10, the output CLK generating circuit 130 generates the first output clock signal OUTP1X in accordance with the output control signal OE0Z, which is generated in response to the 0° read command RED0Z. Further, the output CLK generating circuit 130 generates the second output clock signal OUTP2X in accordance with the output control signal OE18Z, which is generated in response to the 180° read command RED180Z.

The output CLK generating circuit 130 always outputs the first output clock signal OUTP1X half a cycle before the second output clock signal OUTP2X regardless of whichever of the output control signals OE0Z, OE18Z is provided first.

The output buffer 150 outputs the second data signal D2 in response to a low second clock signal OUTP2X after the first data signal D1 is output in response to a low first output clock signal OUTP1X. Thus, the first data signal D1 is always output before the second data signal D2. The first and second data signals D1, D2 are output alternately for a number corresponding to the burst length.

(2) The Hiz generating circuit 140 receives the output control signal OE0Z or OE18Z and outputs a low Hiz signal HIZEZ when the output control signal is invalidated.

The first and second high impedance control portions 150d, 150e of the output buffer 150 deactivate the first and second output transistors T31, T32 of the buffer circuit 150a in response to a low Hiz signal HIZEZ and set the output of the buffer circuit 150a to a high impedance state. That is, the output of the output buffer 150 is immediately set to a high impedance state after reading the read data D. Thus, the latch circuits 251, 253 of the buffer circuit 150a do not continuously hold the finally output read data D.

(3) In the normal mode, the NAND circuit 279 and the NOR circuit 284 of the first and second high impedance control portions 150d, 150e receive first and second mode control signals SGHZ1, SGHZ2 having the low level and set the output of the output buffer 150 to a high impedance state immediately after the read data D is output from the output buffer.

In the test mode, when the transfer gate circuit 280 is activated by a low Hiz signal HIZEZ and the first mode control signal SGHZ1 is set at a low level, the output transistors T31, T32 are activated and deactivated using the second mode control signal SGHZ2 as test data. This facilitates testing of the output buffer 150.

(4) The burst waveform altering circuit 115c delays the falling of a high output control signal OE0Z, which is output from the output control signal generating circuit 115b, by half a cycle of the internal clock when the burst length is 1. That is, the first output CLK control circuit 115 generates an output control signal OE0Z that is held at a high level longer by half a cycle of the internal clocks CLKIN1, CLKIN2, CLKOUT1, CLKOUT2. Thus, the data output circuit 100 can read data having a burst length of 1.

(5) The mode setting circuit 115a selects one of the first to third late signals LAT1Z, LAT2Z, LAT3Z, which is set to output the read data D after counting eight, ten, or twelve of the pulses of the external clock signal CLK from when the read command is acquired, in accordance with the first to third mode signals MDL1Z, MDL2Z, MDL3Z. Thus, the output timing of the read data is selected from three timings.

The first to third late signals LAT1Z, LAT2Z, LAT3Z are generated when the first to third counter portions 80, 80a, 80b of the first latency counter 114 counts a predetermined number of the pulses of the first output internal clock signal CLKOUT1.

The first to third late signals LAT1Z, LAT2Z, LAT3Z are generated prior to the output timing of the read data D. This is because the first latency counter 114 cannot count the first output internal clock signal CLKOUT1 corresponding to the first internal clock signal CLKIN1 that acquires the read command since the phase of the first output internal clock signal CLKOUT1 is advanced from that of the first input internal clock signal CLKIN1. Thus, the first latency counter 114 makes an assumption as to the number of pulses of the first output internal clock signal CLKOUT1 and to the operation delay time of the first output CLK control circuit 115 and the output CLK generating circuit 130 so that the first to third late signals LAT1Z, LAT2Z, LAT3Z are raised before the output timing of the read data D.

Therefore, the read data D is output in accordance with the first or second output internal clock signals CLKOUT1, CLKOUT2 a predetermined time after the read command and addresses are acquired by the first and second input internal clock signals CLKIN1, CLKIN2.

It should be apparent to those skilled in the art that the present invention may be embodied in many other specific forms without departing from the spirit or scope of the invention. Therefore, the present example and embodiment are to be considered as illustrative and not restrictive, and the invention is not to be limited to the details given herein, but may be modified within the scope and equivalence of the appended claims.

What is claimed is:

1. A semiconductor memory device comprising:
   a first output control circuit for receiving a command synchronized with a first input internal clock signal and generating a first output control signal based on the command;
   a second output control circuit for receiving the command synchronized with a second input internal clock signal having a phase differing from that of the first input internal clock signal and generating a second output control signal based on the command;
   an output clock generating circuit connected to the first and second output control circuits, wherein the output clock generating circuit receives either the first output control signal or the second output control signal, a first output internal clock signal, and a second output internal clock signal, the first and second output internal clock signals having phases that are advanced from those of the first and second input internal clock signals, and generates a first output clock signal and a second output clock signal delayed from the first output clock signal; and
   an output buffer connected to the output clock generating circuit, wherein the output buffer receives a first data signal and a second data signal and outputs the first and second data signals in accordance with the first and second output clock signals.

2. The device according to claim 1, wherein the first and second output control circuits generate the first and second output control signals after a predetermined amount of time elapses from when the command is acquired.

3. The device according to claim 1, wherein the first output control circuit includes a first output clock control circuit connected to the output clock generating circuit for generating the first output control signal to validate the first output clock signal over a period corresponding to a predetermined burst length, and wherein the second output control circuit includes a second output clock control circuit connected to the output clock generating circuit for generating the second output control signal to validate the second output clock signal over a period corresponding to the predetermined burst length.

4. The device according to claim 3, wherein the first output clock control circuit includes a first burst waveform altering circuit for altering the waveform of the first output control signal when the predetermined burst length is set at 1 to validate the first output clock signal over a period corresponding to the burst length of 1, and wherein the second output clock control circuit includes a second burst waveform altering circuit for altering the waveform of the second output control signal when the predetermined burst length is set at 1 to validate the second output clock signal over a period corresponding to the burst length of 1.

5. The device according to claim 1, wherein the output buffer includes a buffer circuit that outputs the first and second data signals, and a high impedance control circuit connected to the buffer circuit to set an output terminal of the buffer circuit in a high impedance state when the output of the first and second data signals is terminated.

6. The device according to claim 5, wherein the high impedance control circuit includes a test data input circuit for receiving a test data signal when in a test mode and providing the test data signal to the buffer circuit.

7. The device according to claim 1 further comprising a high impedance generating circuit connected to the first and second output control circuits, wherein the high impedance generating circuit generates a first high impedance signal in response to the first output control signal and a second high impedance signal in response to the second output control signal, and wherein the output buffer sets an output terminal thereof in a high impedance state in accordance with either the first high impedance signal or the second high impedance signal.

8. The device according to claim 1, wherein the first output control circuit includes:
   a first counter reset circuit for receiving the command, generating a first count reset signal, and generating a first divided clock signal by dividing the first output internal clock signal;
   a first burst length counter connected to the first counter reset circuit, wherein the first burst length counter counts the first divided clock signal in response to the first count reset signal and generates a first burst length signal;
   a first burst length shaping circuit connected to the first counter reset circuit and the first burst length counter, wherein the first burst length shaping circuit generates a first burst length shaping signal activated in response to the first count reset signal and in accordance with the first burst length signal;
   a first latency counter connected to the first burst length shaping circuit, wherein the first latency counter counts a first predetermined number of the cycles of the first output internal clock signal in response to the first burst length shaping signal and generates a first late signal; and
   a first output clock control circuit connected to the first latency counter, wherein the first output clock control circuit receives the first late signal and generates the first output control signal by shifting the first late signal by a second predetermined number of cycles of the second output internal clock signal;
   and wherein the second output control circuit includes:
   a second counter reset circuit for receiving the command, generating a second count reset signal, and generating a second divided clock signal by dividing the second output internal clock signal;
   a second burst length counter connected to the second counter reset circuit, wherein the second burst length counter counts the second divided clock signal in response to the second count reset signal and generates a second burst length signal;

a second burst length shaping circuit connected to the second counter reset circuit and the second burst length counter, wherein the second burst length shaping circuit generates a second burst length shaping signal activated in response to the second count reset signal and in accordance with the second burst length signal;

a second latency counter connected to the second burst length shaping circuit, wherein the second latency counter counts a third predetermined number of cycles of the second output internal clock signal in response to the second burst length shaping signal and generates a second late signal; and a second output clock control circuit connected to the second latency counter, wherein the second output clock control circuit receives the second late signal and generates the second output control signal by shifting the second late signal by a fourth predetermined number of cycles of the first output internal clock signal.

9. The device according to claim 8, wherein the first output clock control circuit includes a first burst waveform altering circuit for altering the waveform of the first output control signal when the burst length is set at 1 to validate the first output clock signal over a period corresponding to the burst length of 1, and wherein the second output clock control circuit includes a second burst waveform altering circuit for altering the waveform of the second output control signal when the burst length is set at 1 to validate the second output clock signal over a period corresponding to the burst length of 1.

10. The device according to claim 8, wherein the output buffer includes a buffer circuit to output the first and second data signals, and a high impedance control circuit connected to the buffer circuit to set an output terminal of the buffer circuit in a high impedance state when the output of the first and second data signals is terminated.

11. The device according to claim 10, wherein the high impedance control circuit includes a test data input circuit for receiving a test data signal when in a test mode and providing the test data signal to the buffer circuit.

12. A semiconductor memory device comprising:

an output control circuit for acquiring a command synchronized with an input internal clock signal and generating an output control signal that determines the output timing of a data signal after a predetermined amount of time elapses from when the command is acquired; and an output buffer for receiving the output control signal to output the data signal in accordance with an output internal clock signal, the phase of which is advanced from that of the input internal clock signal;

wherein the output control circuit includes a latency counter that generates the output control signal by counting the cycles of a second output internal clock signal, which is delayed from the first output internal clock signal corresponding to the input internal clock signal when the command is acquired, while compensating for the first output internal clock signal.

* * * * *